United States Patent
Lin et al.

(10) Patent No.: US 12,191,369 B2
(45) Date of Patent: Jan. 7, 2025

(54) SOURCE AND DRAIN ENGINEERING PROCESS FOR MULTIGATE DEVICES

(71) Applicant: Taiwan Semiconductor Manufacturing Company, Ltd., Hsin-Chu (TW)

(72) Inventors: Po-Yu Lin, New Taipei (TW); Wei-Yang Lee, Taipei (TW); Chia-Pin Lin, Hsinchu County (TW); Tzu-Hua Chiu, Hsinchu (TW); Kuan-Hao Cheng, Hsinchu (TW); Wei-Han Fan, Hsin-Chu (TW); Yee-Chia Yeo, Hsinchu (TW); Wei Hao Lu, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 237 days.

(21) Appl. No.: 17/464,265

(22) Filed: Sep. 1, 2021

(65) Prior Publication Data
US 2022/0320307 A1 Oct. 6, 2022

Related U.S. Application Data

(60) Provisional application No. 63/168,647, filed on Mar. 31, 2021.

(51) Int. Cl.
*H01L 29/423* (2006.01)
*H01L 21/8234* (2006.01)
(Continued)

(52) U.S. Cl.
CPC ............... *H01L 29/42392* (2013.01); *H01L 21/823418* (2013.01); *H01L 21/823481* (2013.01); *H01L 29/0649* (2013.01); *H01L 29/78618* (2013.01)

(58) Field of Classification Search
CPC .......... H01L 29/42392; H01L 29/0649; H01L 29/78618; H01L 29/0653; H01L 29/0673;
(Continued)

(56) References Cited

U.S. PATENT DOCUMENTS 9,754,840 B2    9/2017 Lin et al.
9,818,872 B2    11/2017 Ching et al.
(Continued)

*Primary Examiner* — Dao H Nguyen
(74) *Attorney, Agent, or Firm* — HAYNES AND BOONE, LLP

(57) ABSTRACT

Multi-gate devices and methods for fabricating such are disclosed herein. An exemplary method includes forming a semiconductor stack on a substrate, wherein the semiconductor stack includes a first semiconductor layers and a second semiconductor layers alternatively disposed, the first semiconductor layers and the second semiconductor layers being different in composition; patterning the semiconductor stack to form a semiconductor fin; forming a dielectric fin next to the semiconductor fin; forming a first gate stack on the semiconductor fin and the dielectric fin; etching to a portion of the semiconductor fin within a source/drain region, resulting in a source/drain recess; and epitaxially growing a source/drain feature in the source/drain recess, defining an airgap spanning between a sidewall of the source/drain feature and a sidewall of the dielectric fin.

20 Claims, 15 Drawing Sheets

(51) Int. Cl.
*H01L 29/06* (2006.01)
*H01L 29/786* (2006.01)

(58) Field of Classification Search
CPC ........... H01L 29/0847; H01L 29/66545; H01L 29/78696; H01L 21/823418; H01L 21/823481; H01L 21/823814; H01L 21/823878; H01L 27/088
See application file for complete search history.

(56) References Cited

U.S. PATENT DOCUMENTS

| | | | |
|---|---|---|---|
| 10,032,627 B2 | 7/2018 | Lee et al. | |
| 10,290,546 B2 | 5/2019 | Chiang et al. | |
| 10,475,902 B2 | 11/2019 | Lee et al. | |
| 10,950,731 B1 | 3/2021 | Peng et al. | |
| 11,031,292 B2 | 6/2021 | Ju et al. | |
| 11,637,179 B2 * | 4/2023 | Cheng | H01L 21/764 257/329 |
| 2015/0017776 A1 * | 1/2015 | Tsai | H01L 21/324 438/283 |
| 2020/0044045 A1 * | 2/2020 | Wang | H01L 29/66439 |
| 2020/0075423 A1 * | 3/2020 | Kwok | H01L 21/823481 |
| 2020/0105753 A1 * | 4/2020 | Kotlyar | H01L 29/785 |
| 2020/0135893 A1 * | 4/2020 | Bi | H01L 29/66553 |
| 2020/0365586 A1 * | 11/2020 | Shin | H01L 29/0673 |
| 2020/0411661 A1 * | 12/2020 | Guler | H01L 29/66484 |
| 2021/0226032 A1 * | 7/2021 | Reznicek | H01L 29/66545 |
| 2021/0408283 A1 * | 12/2021 | Agrawal | H01L 29/42392 |
| 2022/0102554 A1 * | 3/2022 | Guttman | H01L 21/76224 |

* cited by examiner

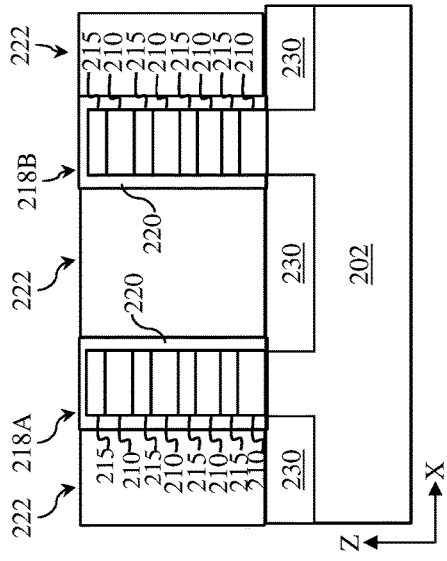
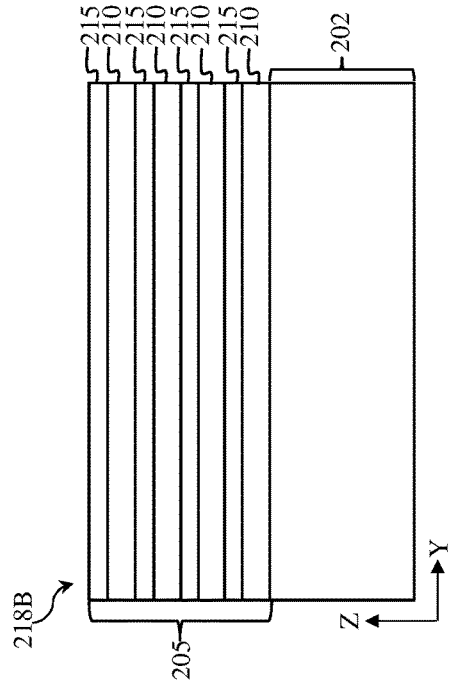
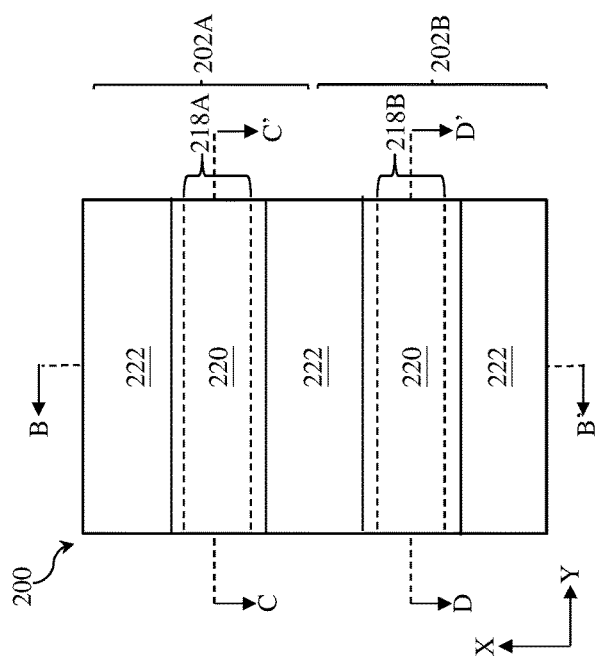
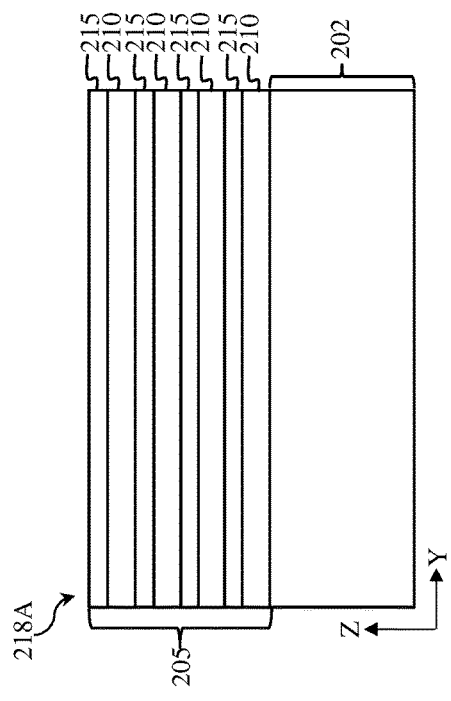

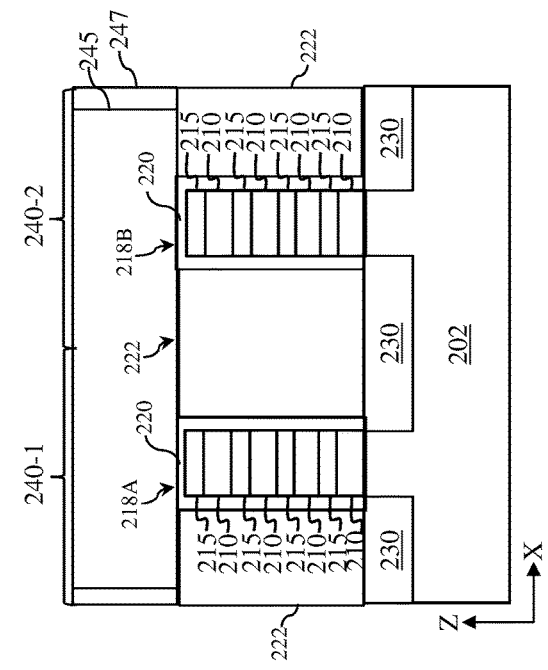
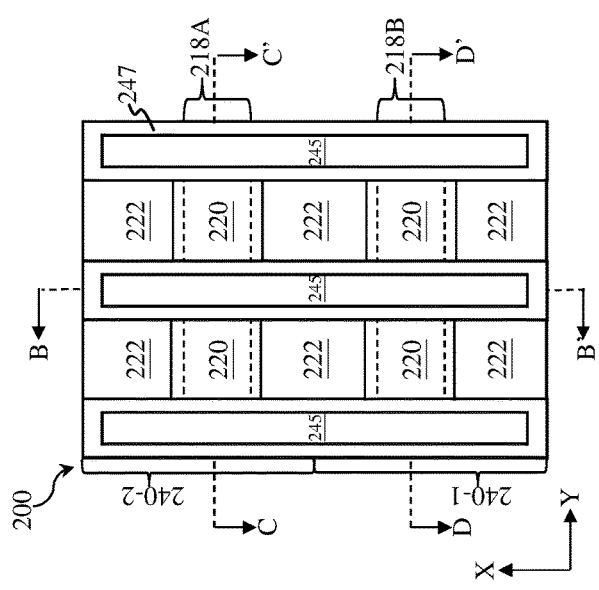
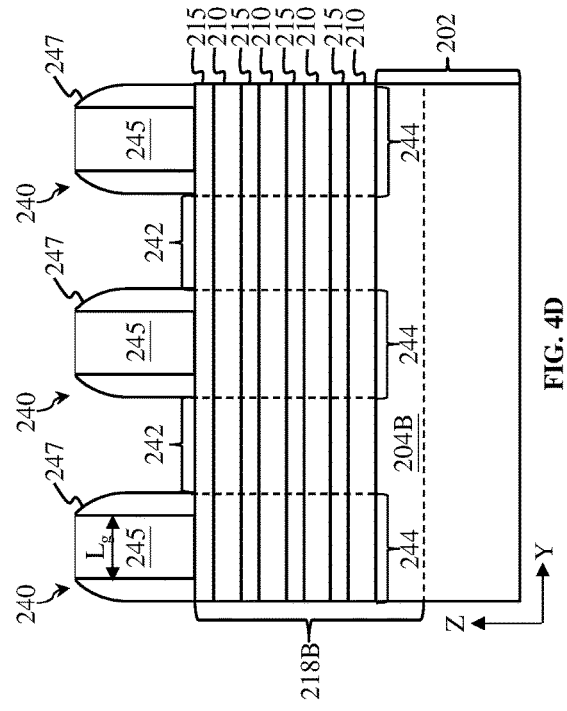
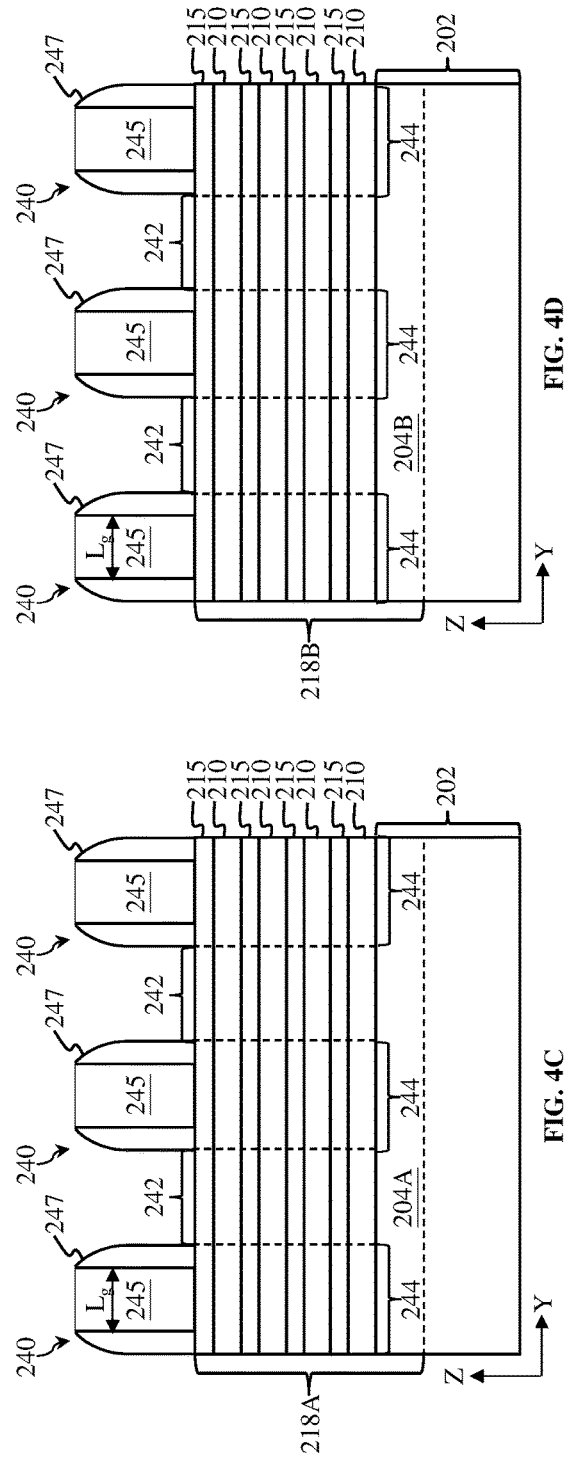

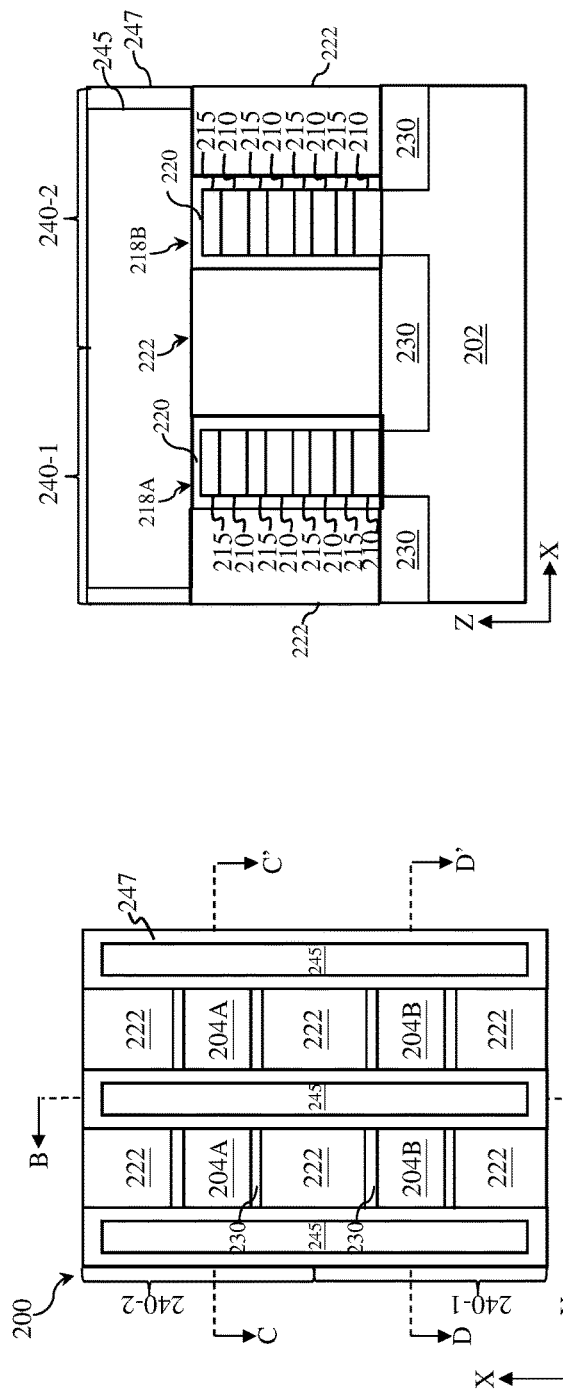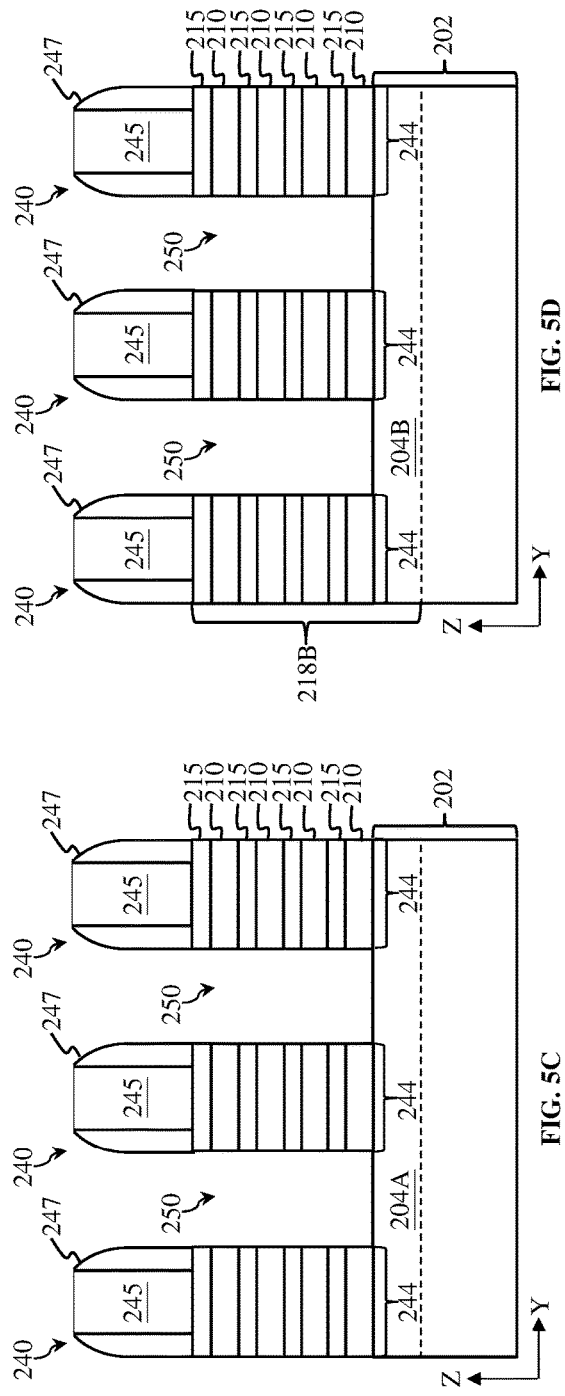
FIG. 5A
FIG. 5B
FIG. 5C
FIG. 5D

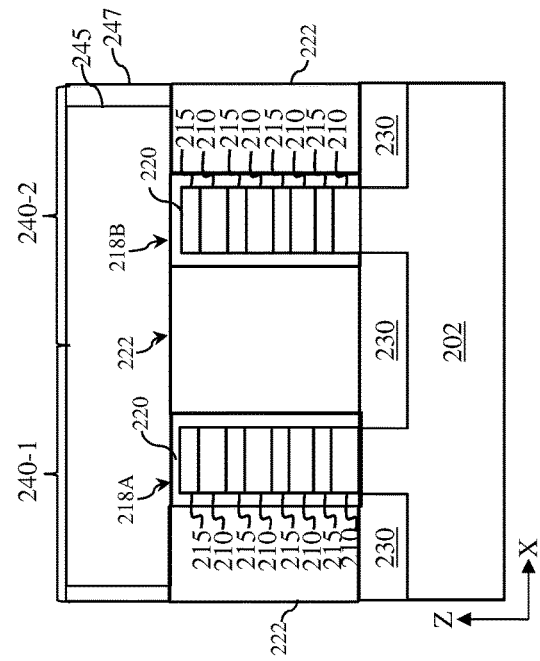
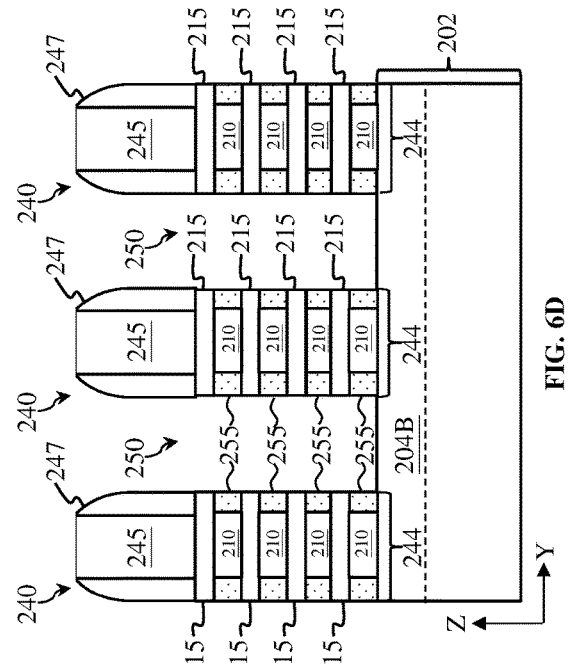
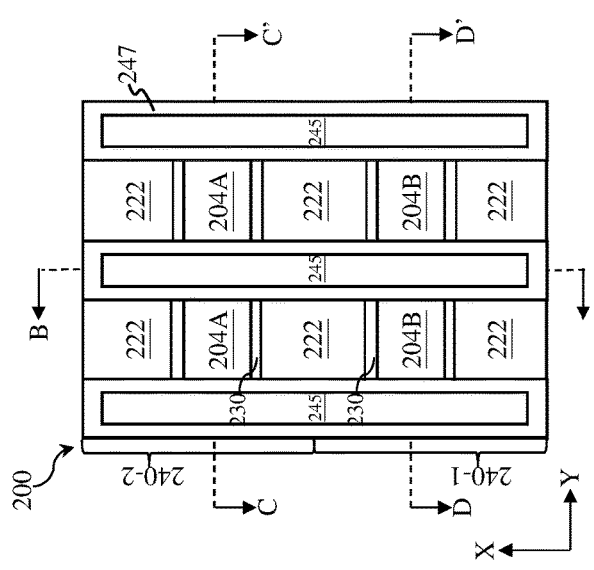
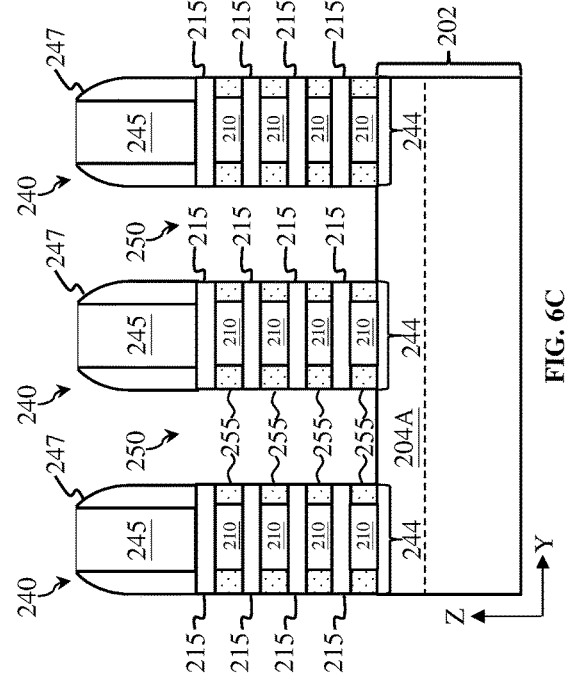
FIG. 6A
FIG. 6B
FIG. 6C
FIG. 6D

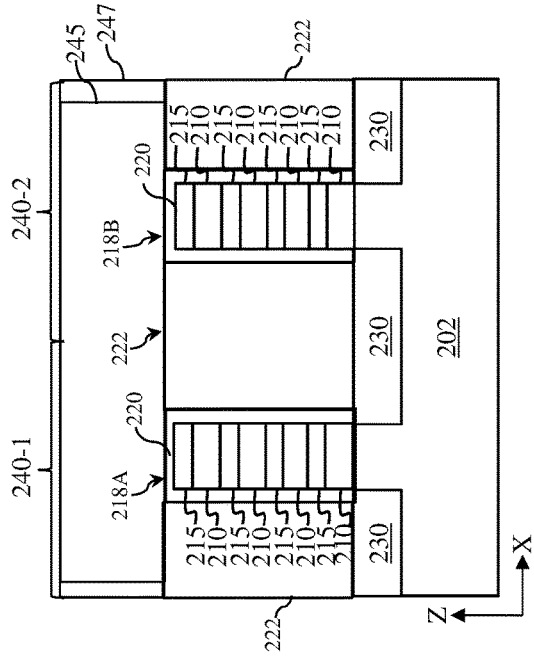
FIG. 7A
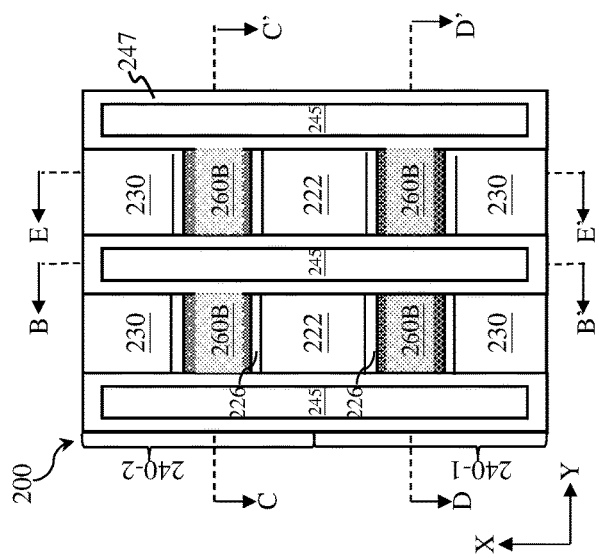
FIG. 7B
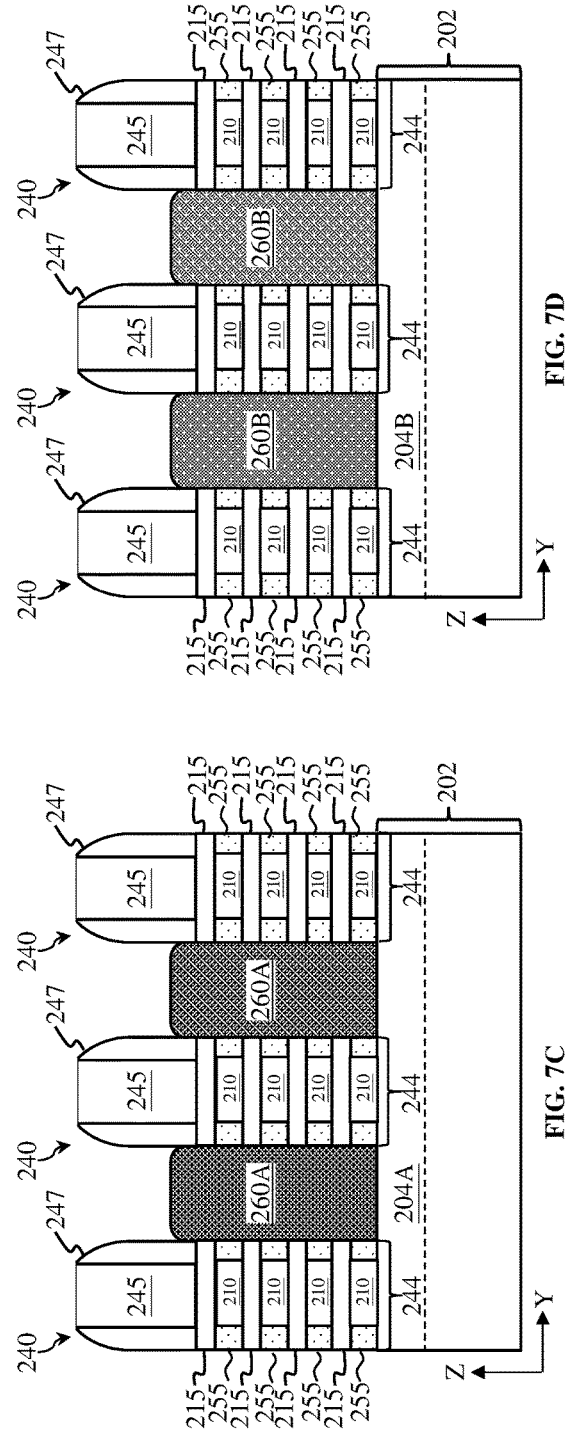
FIG. 7C
FIG. 7D

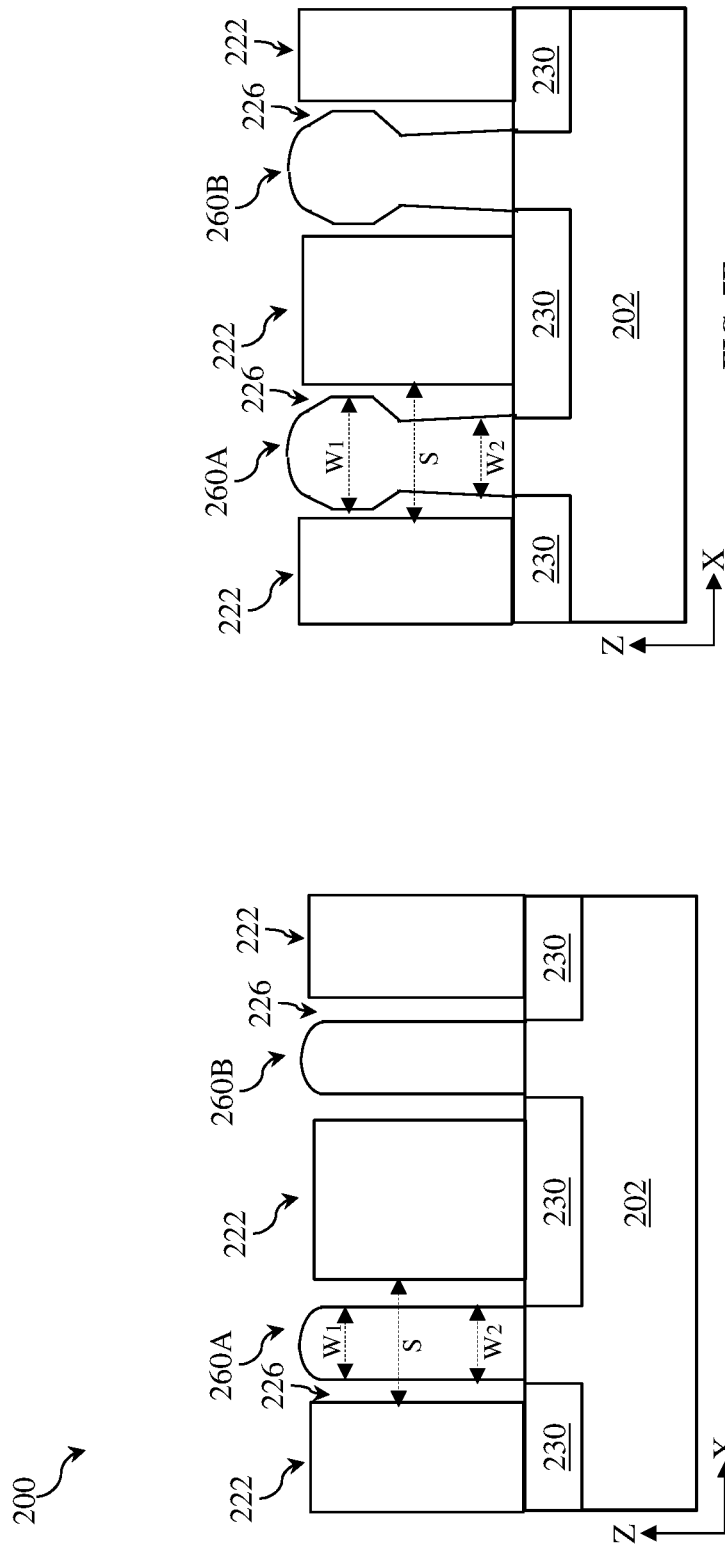

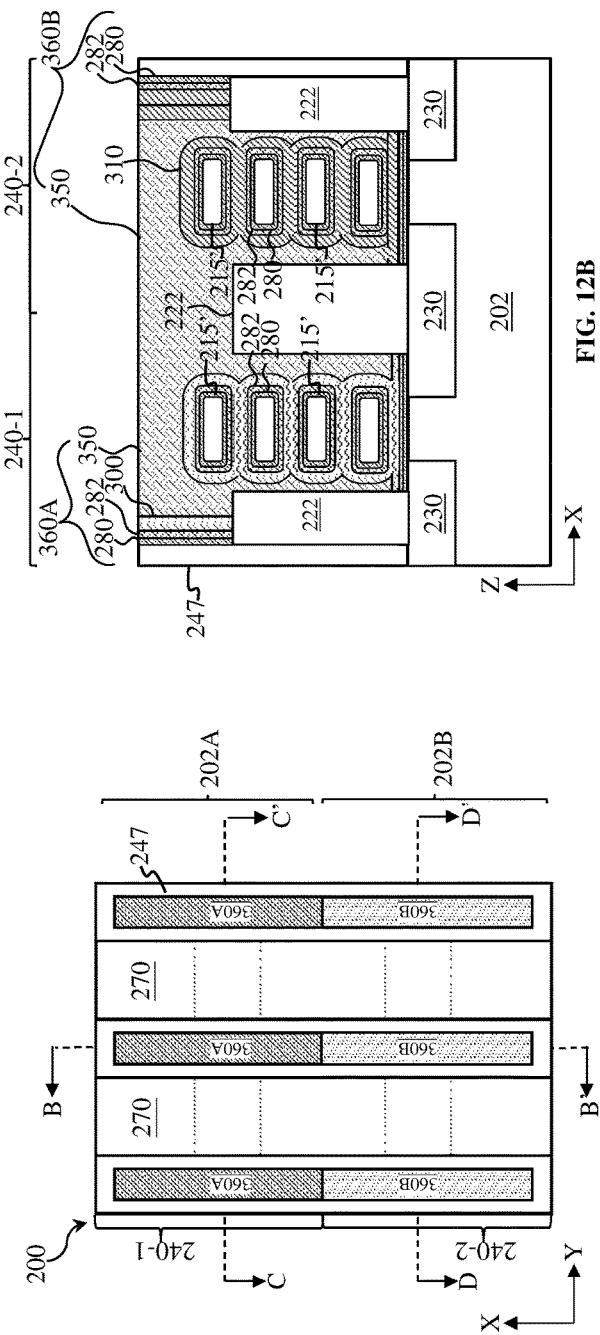
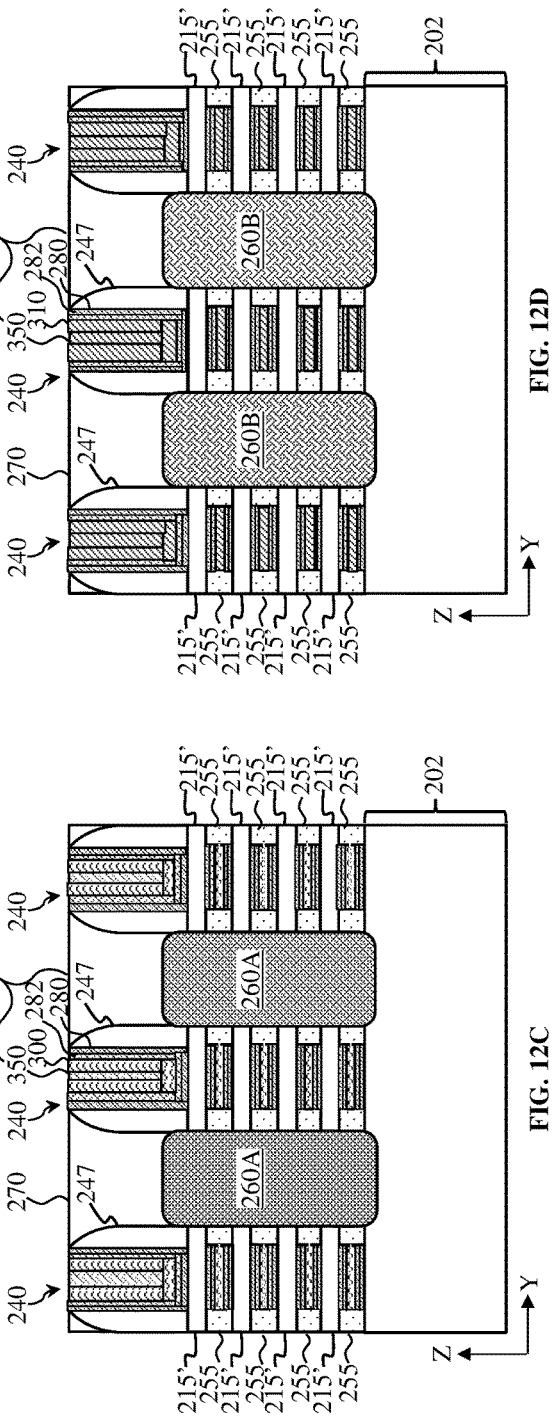
FIG. 12A
FIG. 12B
FIG. 12C
FIG. 12D

SOURCE AND DRAIN ENGINEERING PROCESS FOR MULTIGATE DEVICES

BACKGROUND

This application claims priority to U.S. Provisional Patent Application Ser. No. 63/168,647 filed Mar. 31, 2021, the entire disclosure of which is hereby incorporated herein by reference.

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, challenges have arisen. For example, the existing structures and fabrication technologies have various issues, which includes increased parasitic capacitance; increased contact resistance; short channel effect (SCE); and other structure-related issues and/or process-related issues. Although existing structure and fabrication techniques have been generally adequate for achieving different IC structure, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-6A, FIGS. 2B-6B, FIGS. 2C-6C, FIGS. 2D-6D, and FIGS. 3E-3F are fragmentary diagrammatic views of a multigate device, in portion or entirety, at various fabrication stages (such as those associated with the method in FIG. 1) according to various aspects of the present disclosure.

FIGS. 7A, 7B, 7C, 7D, 7E and 7F are fragmentary diagrammatic views of a multigate device, in portion or entirety, at various fabrication stages (such as those associated with the method in FIG. 1) according to various aspects of the present disclosure.

FIGS. 10A-12A, FIGS. 10B-12B, FIGS. 10C-12C, and FIGS. 10D-12D are fragmentary diagrammatic views of a multigate device, in portion or entirety, at various fabrication stages (such as those associated with the method in FIG. 1A and FIG. 1B) according to various aspects of the present disclosure.

DETAILED DESCRIPTION

Figure 1:
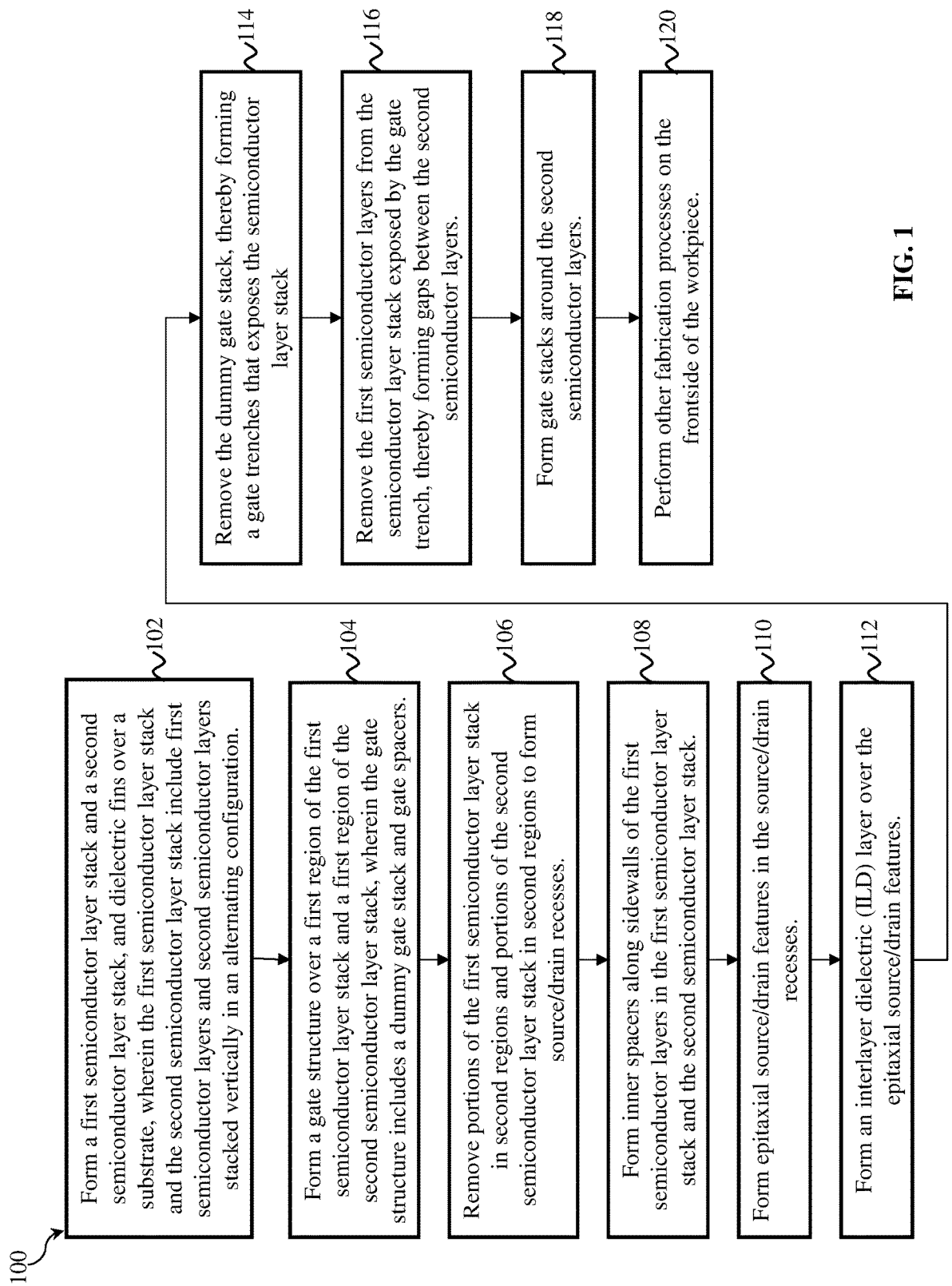
FIG. 1 is a flowchart of a method for fabricating a multigate device according to various aspects of the present disclosure.
Figure 2A:
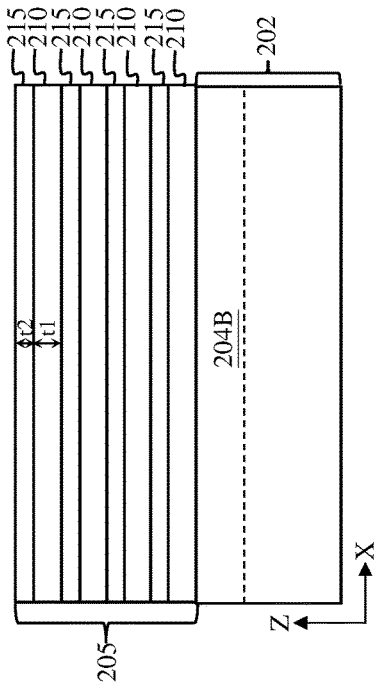
Figure 2B:
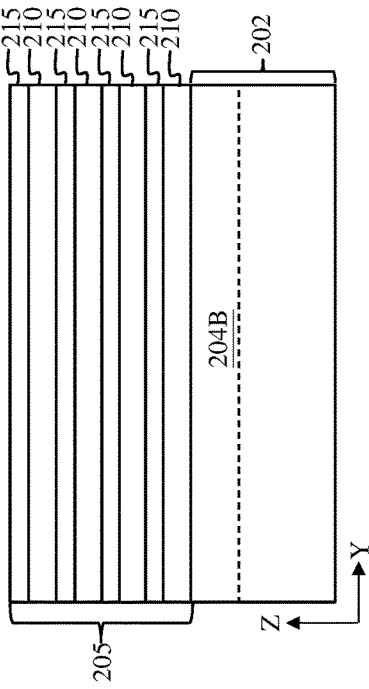
Figure 2C:
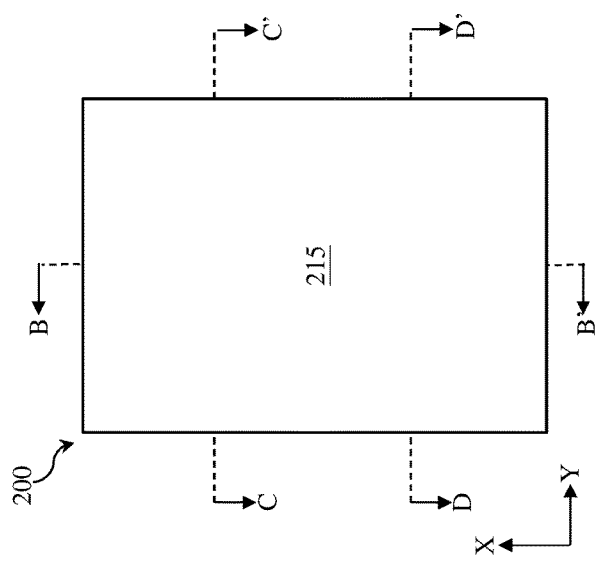
Figure 2D:
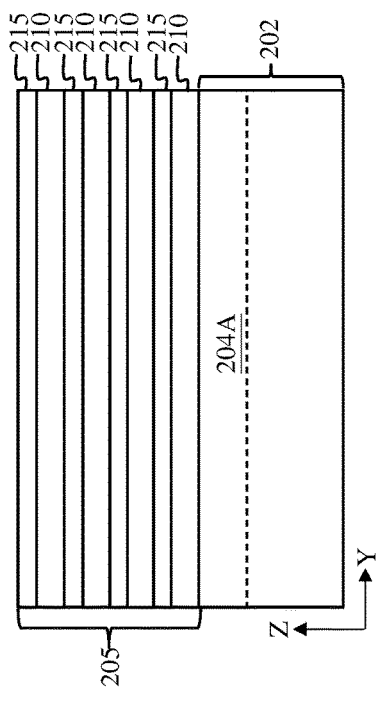

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example. "lower," "upper." "horizontal," "vertical," "above," "over," "below," "beneath," "up." "down," "top," "bottom," etc. as well as derivatives thereof (e.g., "horizontally." "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

FIG. 1 illustrates a flowchart of a method 100 for fabricating a multi-gate device according to various aspects of the present disclosure. In some embodiments, method 100 fabricates a multi-gate device that includes p-type GAA transistors and n-type GAA transistors. In some embodiments, method 100 fabricates a multi-gate device that includes first GAA transistors and second GAA transistors with different characteristics, such as different functions (e.g., logic device or memory device) or different conductivity type (e.g., n-type transistor or p-type transistor). In the disclosed structure and the method making the same, device structure, especially profiles of source/drain (S/D) features, are designed differently to optimize respective device performance, including reduced parasitic capacitance and reduced contact resistance. Particularly, the GAA transistors include S/D features with a bar-like profile or lollipop-like profile for and adjacent airgap to collectively reduce the parasitic capacitance and the contact resistance according to various embodiments.

In some embodiments, method 100 fabricates a multi-gate device that includes p-type GAA transistors and n-type GAA transistors. At block 102, a first semiconductor layer stack and a second semiconductor layer stack are formed over a substrate. The first semiconductor layer stack and the second semiconductor layer stack include first semiconductor layers and second semiconductor layers stacked vertically in an alternating configuration. In some embodiments, the operation 102 includes depositing various semiconductor materials (such as alternatively silicon and silicon germanium); patterning the stacked semiconductor materials to form semiconductor fins (or fins); and form isolation features, such as shallow trench isolation features to isolate fins. A cladding layer may be formed on the sidewalls of the first and second semiconductor layer stacks. In some embodiments, dielectric fins may be formed on the substrate among the fins. Dielectric fins have similar profile as fins but consist dielectric material(s) with benefits, such as tuning the fin density. At block 104, a gate structure is formed over a first region of the first semiconductor layer stack and a first region of the second semiconductor layer stack. The gate structure includes a dummy gate stack and gate spacers. A lightly doped drain (LDD) implantation may be implemented and the cladding layer may be removed between the formation of the dummy gate and the gate spacers. At block 106, portions of the first semiconductor layer stack in second regions and portions of the second semiconductor layer stack in second regions are removed to form source/drain recesses. At block 108, inner spacers are formed along sidewalls of the first semiconductor layers in the first semiconductor layer stack and the second semiconductor layer stack. At block 110, epitaxial source/drain (S/D) features are formed in the source/drain recesses. Especially, the operation at block 110 is designed to form S/D features with desired profiles, air gaps and improved circuit performance, the details of which are further described later. At block 112, an interlayer dielectric (ILD) layer is formed over the epitaxial source/drain features. At block 114, the dummy gate stack is removed, thereby forming a gate trench that exposes the first semiconductor layer stack in a first gate region and the second semiconductor layer stack in a second gate region. At block 116, the first semiconductor layers are removed from the first semiconductor layer stack and the second semiconductor layer stack exposed by the gate trench, thereby forming gaps between the second semiconductor layers. At block 118, gate stacks are formed in the gate trench around the second semiconductor layers in the first gate region and the second gate region. At block 120, other fabrication processes, including forming an interconnect structure, are performed on the workpiece. Additional steps can be provided before, during, and after method 100, and some of the steps described can be moved, replaced, or eliminated for additional embodiments of method 100. The discussion that follows illustrates various embodiments of nanowire-based (or nanostructure-based) integrated circuit devices that can be fabricated according to method 100.

Figure 8:
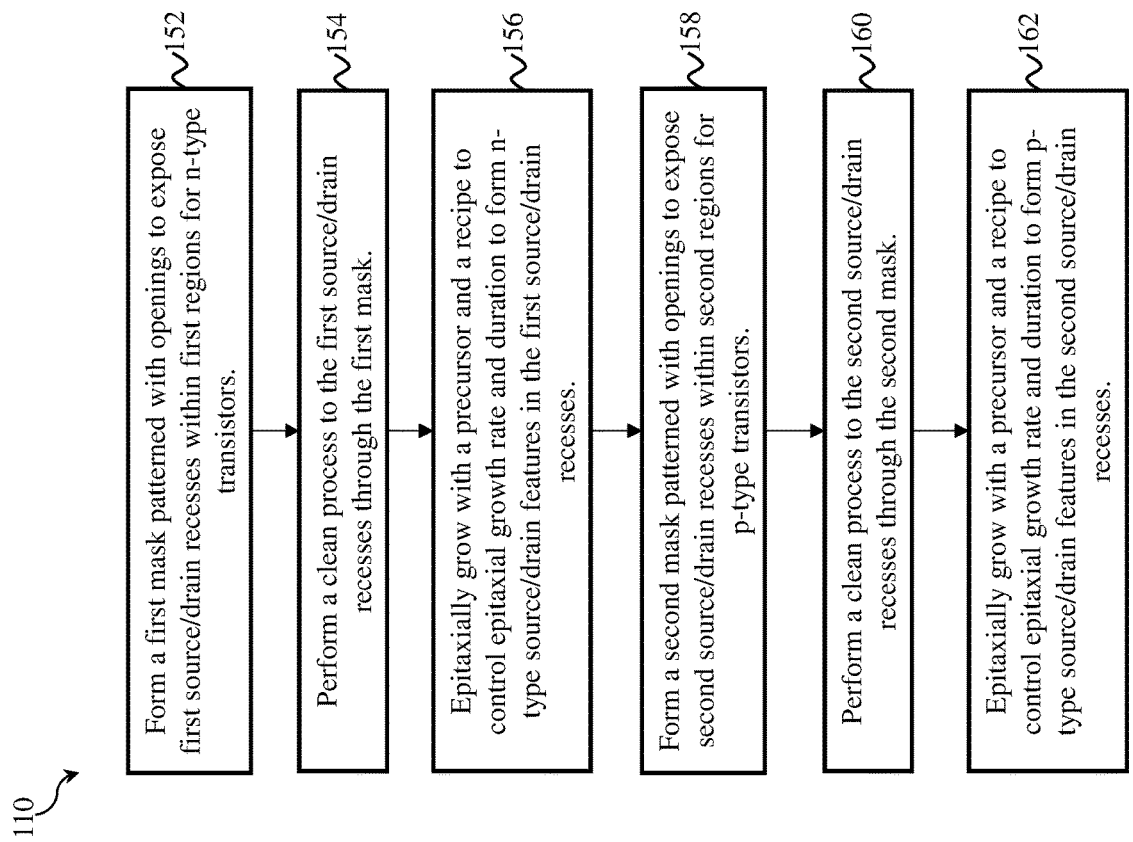
FIG. 8 is a flowchart of a method for fabricating a multigate device according to various aspects of the present disclosure.

FIG. 8 illustrates a flowchart of a method 110 for fabricating a multi-gate device according to various aspects of the present disclosure. The method 110 is portion of the method 100 with more details, especially includes various processing operations for the block 110 of the method 100 to form the source/drain features.

FIGS. 2A-6A, FIGS. 2B-6B, FIGS. 2C-6C, and FIGS. 2D-6D are fragmentary diagrammatic views of a multigate device 200, in portion or entirety, at various fabrication stages (such as those associated with method 100 in FIG. 1) according to various aspects of the present disclosure. In particular, FIGS. 2A-6A are top views of multigate device 200 in an X-Y plane;

FIGS. 2B-6B are diagrammatic cross-sectional views of multigate device 200 in an X-Z plane along lines B-B' respectively of FIGS. 2A-6A, FIGS. 2C-6C are diagrammatic cross-sectional views of multigate device 200 in a Y-Z plane along lines C-C' respectively of FIGS. 2A-6A; and FIGS. 2D-6D are diagrammatic cross-sectional views of multigate device 200 in the Y-Z plane along lines D-D' respectively of FIGS. 2A-6A.

FIG. 7A, FIG. 7B, FIG. 7C, FIG. 7D, FIG. 7E, and FIG. 7F are fragmentary diagrammatic views of a multigate device 200, in portion or entirety, at various fabrication stages (such as those associated with method 100 in FIG. 1 or method 110 in FIG. 8) according to various aspects of the present disclosure. In particular, FIG. 7A is a top view of multigate device 200 in an X-Y plane; FIG. 7B is a diagrammatic cross-sectional view of multigate device 200 in an X-Z plane along lines B-B' of FIG. 7A, FIG. 7C is a diagrammatic cross-sectional view of multigate device 200 in a Y-Z plane along lines C-C' of FIG. 7A; FIG. 7D is a diagrammatic cross-sectional view of multigate device 200 in the Y-Z plane along lines D-D' of FIG. 7A, and FIG. 7E is a diagrammatic cross-sectional view of multigate device 200 in the X-Z plane along lines E-E' of FIG. 7A; and FIG. 7F is a diagrammatic cross-sectional view of multigate device 200 in the X-Z plane along lines E-E' respectively of FIG. 7A constructed according to various embodiments.

Figure 9B:
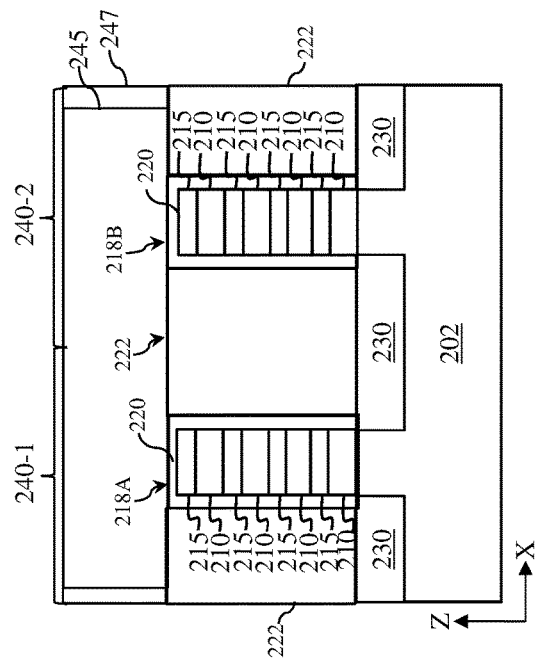
FIGS. 9A, 9B, 9C. 9D, 9E and 9F are fragmentary diagrammatic views of a multigate device, in portion or entirety, at various fabrication stages (such as those associated with the method in FIG. 1 or FIG. 8) according to various aspects of the present disclosure.
Figure 9D:
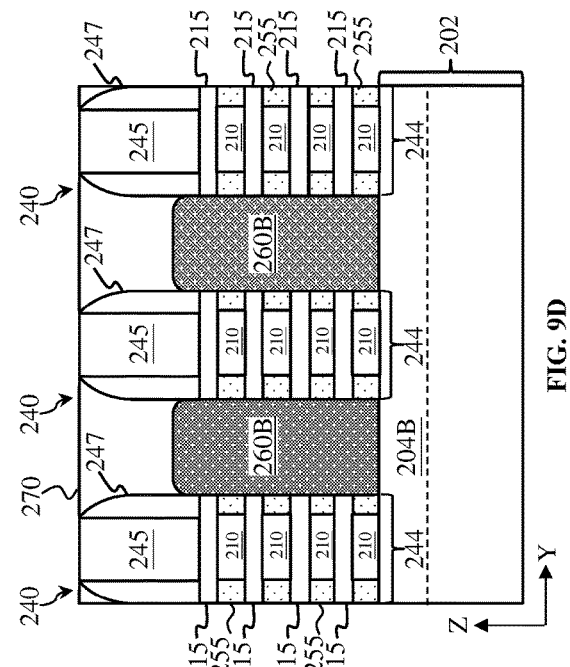
Figure 9A:
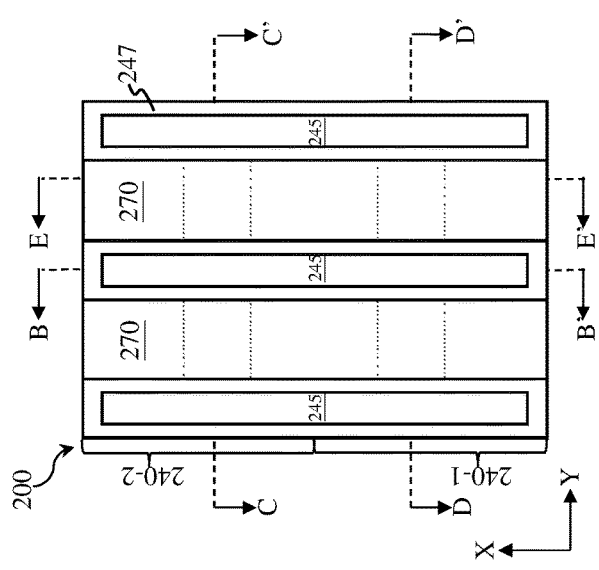
Figure 9C:
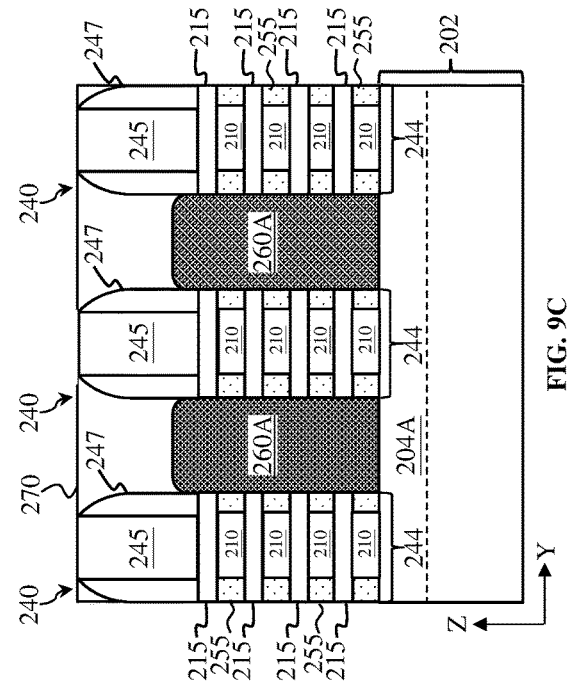
Figure 9F:
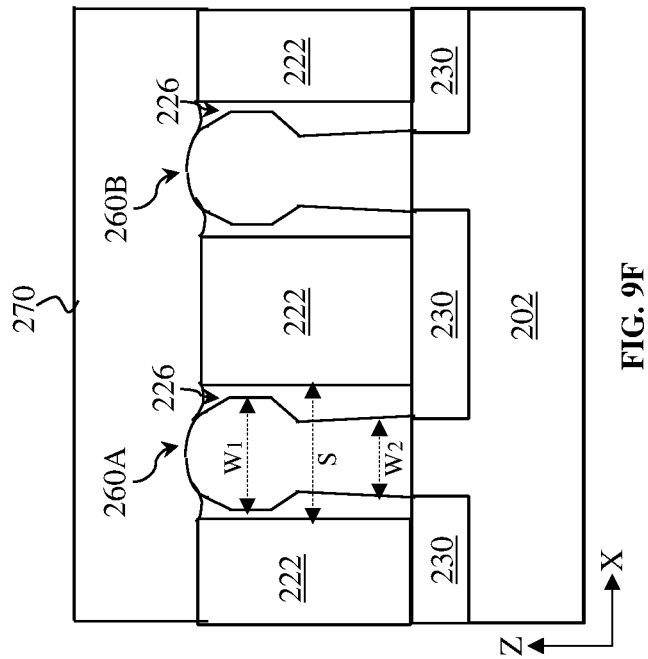
Figure 9E:
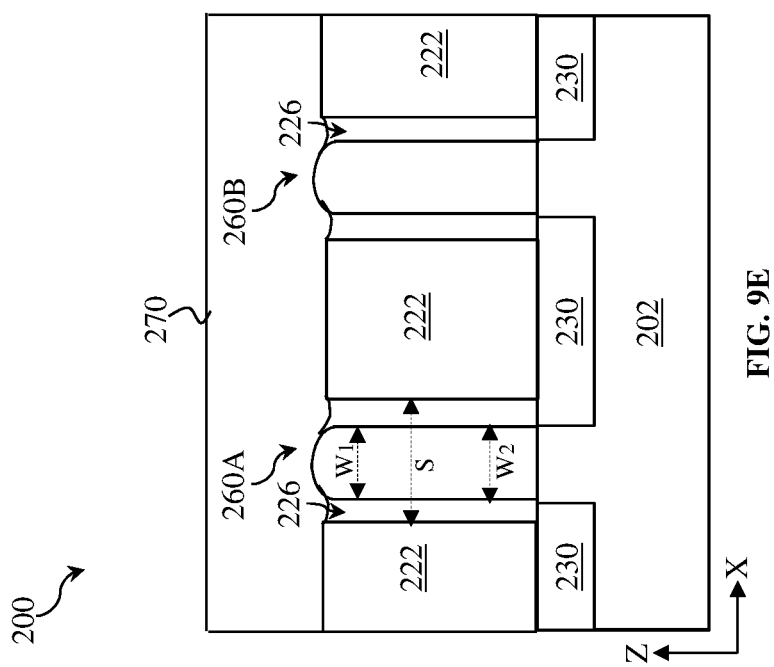
Figure 10B:
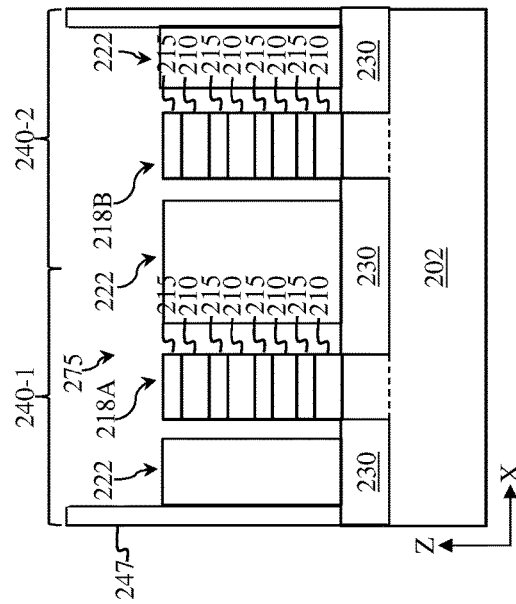
Figure 10D:
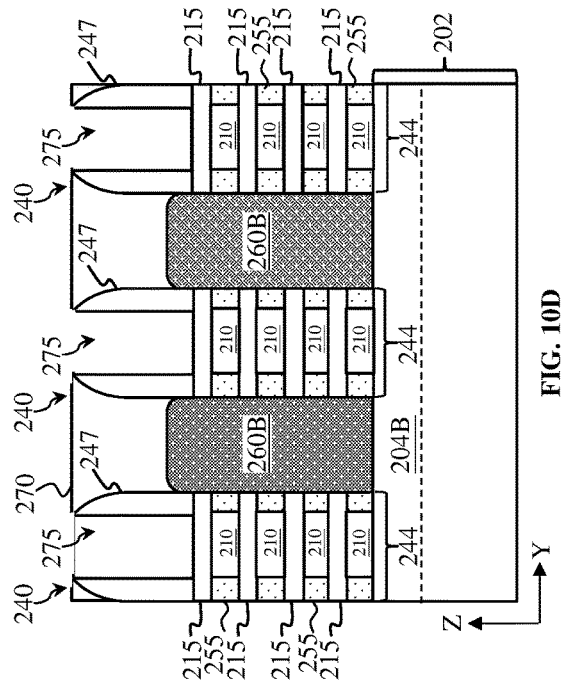
Figure 10A:
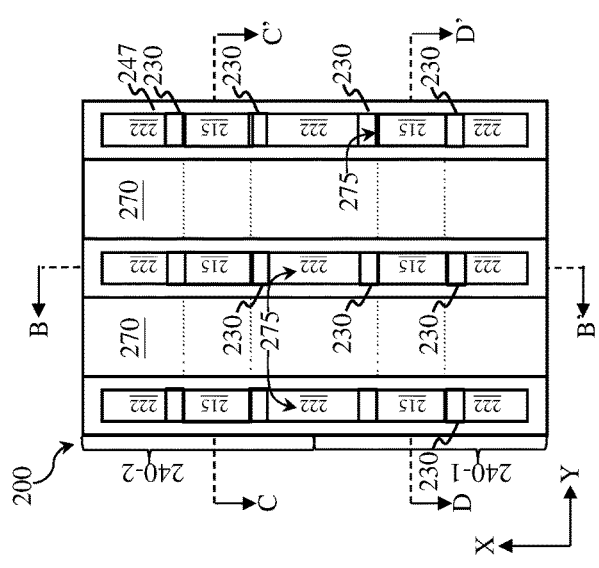
Figure 10C:
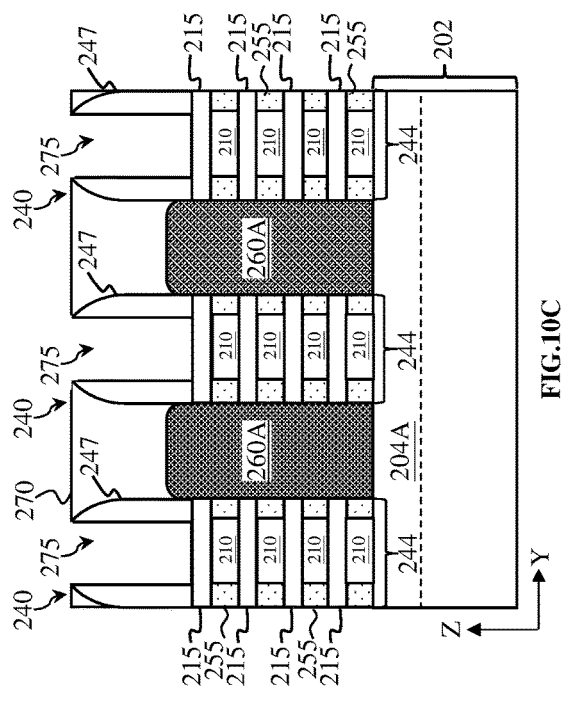
Figure 11A:
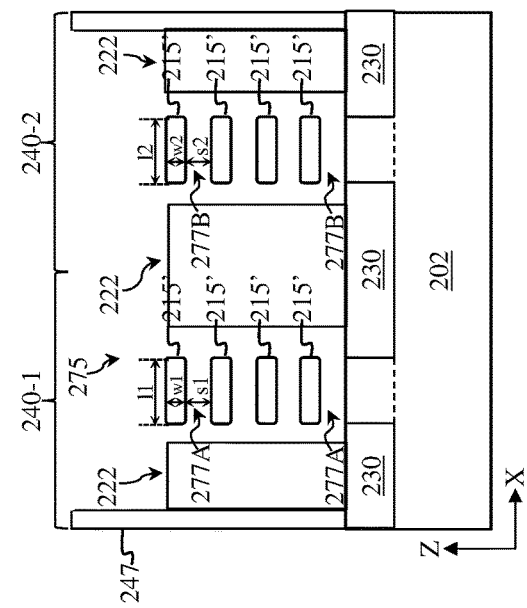
Figure 11C:
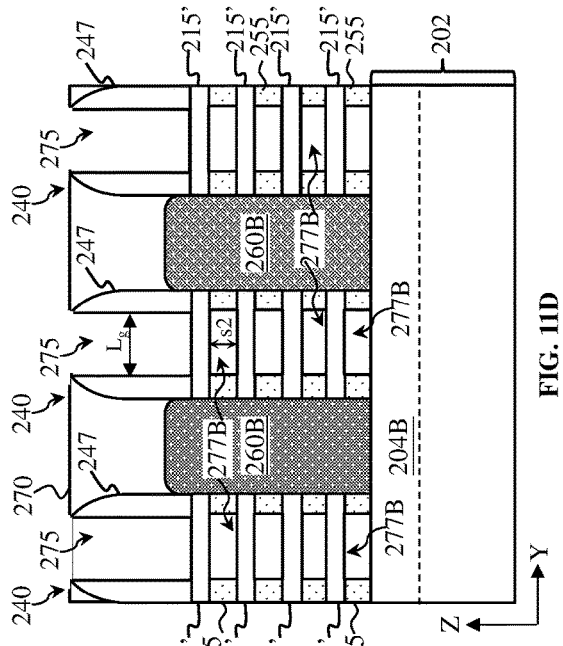
Figure 11B:
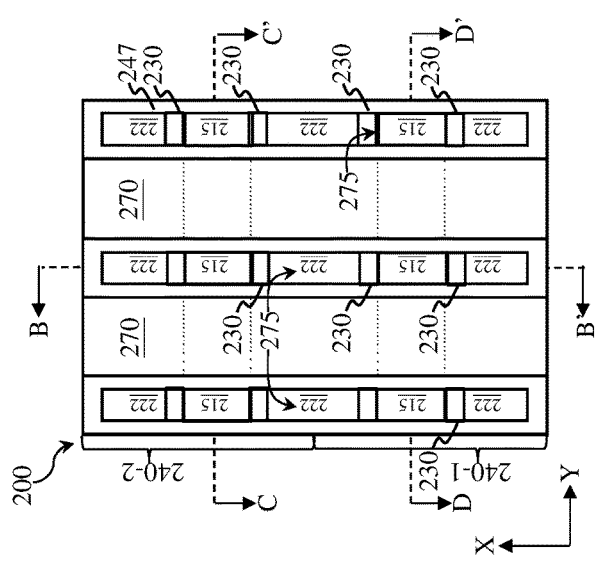
Figure 11D:
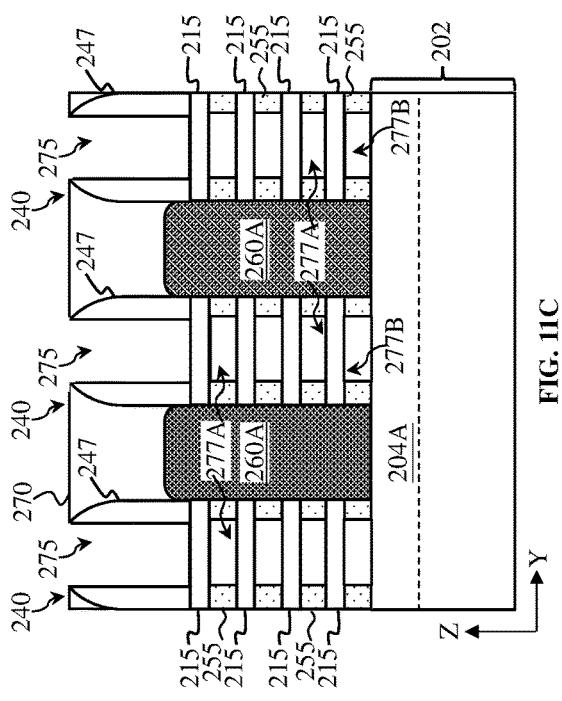

FIG. 9A, FIG. 9B, FIG. 9C. FIG. 9D, FIG. 9E, and FIG. 9F are fragmentary diagrammatic views of a multigate device 200, in portion or entirety, at various fabrication stages (such as those associated with method 100 in FIG. 1) according to various aspects of the present disclosure. In particular, FIG. 9A is a top view of multigate device 200 in an X-Y plane; FIG. 9B is diagrammatic cross-sectional views of multigate device 200 in an X-Z plane along lines B-B' respectively of FIG. 9A, FIG. 9C is a diagrammatic cross-sectional view of multigate device 200 in a Y-Z plane along lines C-C' of FIG. 9A; FIG. 9D is a diagrammatic cross-sectional view of multigate device 200 in the Y-Z plane along lines D-D' respectively of FIG. 9A, and FIG. 9E is a diagrammatic cross-sectional view of multigate device 200 in the X-Z plane along lines E-E' of FIG. 9A; and FIG. 9F is a diagrammatic cross-sectional view of multigate device 200 in the X-Z plane along lines E-E' respectively of FIG. 9A constructed according to various embodiments.

FIGS. 10A-12A, FIGS. 10B-12B, FIGS. 10C-12C, and FIGS. 10D-12D are fragmentary diagrammatic views of a multigate device 200, in portion or entirety, at various fabrication stages (such as those associated with method 100 in FIG. 1) according to various aspects of the present disclosure. In particular, FIGS. 10A-12A are top views of multigate device 200 in an X-Y plane; FIGS. 10B-12B are diagrammatic cross-sectional views of multigate device 200 in an X-Z plane along lines B-B' respectively of FIGS. 10A-12A, FIGS. 10C-12C are diagrammatic cross-sectional views of multigate device 200 in a Y-Z plane along lines C-C' respectively of FIGS. 10A-12A; and FIGS. 10D-12D are diagrammatic cross-sectional views of multigate device 200 in the Y-Z plane along lines D-D' respectively of FIGS. 10A-12A.

Multigate device 200 may be included in a microprocessor, a memory, and/or other IC device. In some embodiments, multigate device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multigate device 200 is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof. Various figures have been simplified for the sake of clarity to better understand the inventive concepts of the present disclosure. Additional features can be added in multigate device 200, and some of the features described below can be replaced, modified, or eliminated in other embodiments of multigate device 200.

Turning to FIGS. 2A-2D, multigate device 200 includes a substrate (e.g., wafer) 202. In the depicted embodiment, substrate 202 includes silicon. Alternatively, or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200. In the depicted embodiment, substrate 202 includes a p-type doped region 204A (referred to hereinafter as a p-well), which can be configured for n-type GAA transistors, and an n-type doped region 204B (referred to hereinafter as an n-well), which can be configured for p-type GAA transistors. N-type doped regions, such as n-well 204B, are doped with n-type dopants, such as phosphorus, arsenic, other n-type dopant, or combinations thereof. P-type doped regions, such as p-well 204A, are doped with p-type dopants, such as boron, indium, other p-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

A semiconductor layer stack 205 is formed over substrate 202, where semiconductor layer stack 205 includes semiconductor layers 210 and semiconductor layers 215 stacked vertically (e.g., along the z-direction) in an interleaving or alternating configuration from a surface of substrate 202. In some embodiments, semiconductor layers 210 and semiconductor layers 215 are epitaxially grown in the depicted interleaving and alternating configuration. For example, a first one of semiconductor layers 210 is epitaxially grown on substrate, a first one of semiconductor layers 215 is epitaxially grown on the first one of semiconductor layers 215, a second one of semiconductor layers 210 is epitaxially grown on the first one of semiconductor layers 215, and so on until semiconductor layers stack 205 has a desired number of semiconductor layers 210 and semiconductor layers 215. In such embodiments, semiconductor layers 210 and semiconductor layers 215 can be referred to as epitaxial layers. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of multigate device 200. In the depicted embodiment, semiconductor layer stack 205 includes four semiconductor layers 210 and four semiconductor layers 215 configured to form four semiconductor layer pairs disposed over substrate 202, each semiconductor layer pair having a respective first semiconductor layer 210 and a respective second semiconductor layer 215. After undergoing subsequent processing, such configuration will result in multigate device 200 having four channels. However, the present disclosure contemplates embodiments where semiconductor layer stack 205 includes more or less semiconductor layers, for example, depending on a number of channels desired for multigate device 200 (e.g., a GAA transistor) and/or design requirements of multigate device 200. For example, semiconductor layer stack 205 can include two to ten semiconductor layers 210 and two to ten semiconductor layers 215. In furtherance of the depicted embodiment, semiconductor layers 210 have a thickness t1 and semiconductor layers 215 have a thickness t2, where thickness t1 and thickness t2 are chosen based on fabrication and/or device performance considerations for multigate device 200. For example, thickness t1 can be configured to define a desired distance (or gap) between adjacent channels of multigate device 200 (e.g., between semiconductor layers 215), thickness t2 can be configured to achieve desired thickness of channels of multigate device 200, and both thickness t1 and thickness t2 can be configured to achieve desired performance of multigate device 200. In some embodiments, thickness t1 and thickness t2 are about 1 nm to about 10 nm.

Turning to FIGS. 3A-3D, semiconductor layer stack 205 is patterned to form a fin 218A and a fin 218B (also referred to as fin structures, fin elements, etc.). Fins 218, 218B include a substrate portion (i.e., a portion of substrate 202) and a semiconductor layer stack portion (i.e., a remaining portion of semiconductor layer stack 205 including semiconductor layers 210 and semiconductor layers 215). Fins 218A, 218B extend substantially parallel to one another along a y-direction, having a length defined in the y-direction, a width defined in an x-direction, and a height defined in a z-direction. In some implementations, a lithography and/or etching process is performed to pattern semiconductor layer stack 205 to form fins 218A, 218B. The lithography process can include forming a resist layer over semiconductor layer stack 205 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 205 using the patterned resist layer as an etch mask. In some embodiments, the patterned resist layer is formed over a hard mask layer disposed over semiconductor layer stack 205, a first etching process removes portions of the hard mask layer to form a patterned hard mask layer, and a second etching process removes portions of semiconductor layer stack 205 using the patterned hard mask layer as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) is removed, for example, by a resist stripping process or other suitable process. Alternatively, fins 218A, 218B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning semiconductor layer stack 205. Further, in some embodiments, the exposure process can implement maskless lithography, electron-beam (e-beam) writing, and/or ion-beam writing for patterning the resist layer.

An isolation feature(s) 230 is formed over and/or in substrate 202 to isolate various regions, such as various device regions, of multigate device 200. For example, isolation features 230 surround a bottom portion of fins 218A, 218B, such that isolation features 230 separate and isolate fins 218A, 218B from each other. In the depicted embodiment, isolation features 230 surround the substrate portion of fins 218A, 218B (e.g., doped regions 204A, 204B of substrate 202) and partially surround the semiconductor layer stack portion of fins 218A, 218B (e.g., a portion of bottommost semiconductor layer 210). However, the present disclosure contemplates different configurations of isolation features 230 relative to fins 218A, 218B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. For example, isolation features 230 can include STI features that define and electrically isolate fins 218A, 218B from other active device regions (such as fins) and/or passive device regions. STI features can be formed by etching a trench in substrate 202 (for example, by using a dry etching process and/or a wet etching process) and filling the trench with insulator material (for example, by using a CVD process or a spin-on glass process). A chemical mechanical polishing (CMP) process may be performed to remove excessive insulator material and/or planarize a top surface of isolation features 230. In another example, STI features can be formed by depositing an insulator material over substrate 202 after forming fins 218A, 218B (in some implementations, such that the insulator material layer fills gaps (trenches) between fins 218A, 218B) and etching back the insulator material layer to form isolation features 230. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

In some embodiments, a cladding layer 220 is formed on the sidewalls of the fins 218A, 218B by a suitable method, such as selective epitaxial growth. The cladding layer 220 includes may include a semiconductor material similar to that of the first semiconductor layers 210 in composition. In the depicted embodiment, the cladding layer 220 includes silicon germanium. The cladding layer 220 provides paths to etch the first semiconductor layers 210 and is removed with the first semiconductor layers 210 during a channel-release process at later stage (to be described below). The cladding layer 220 may present on the top surface of the fins according to some embodiments.

Figure 3F:
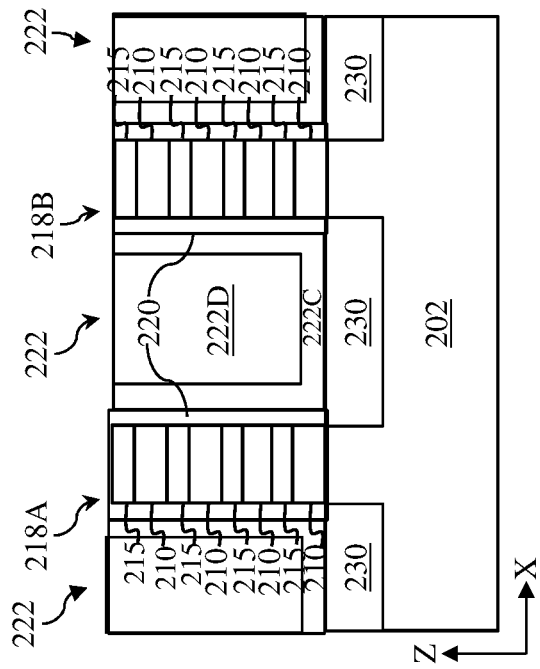
Figure 3E:
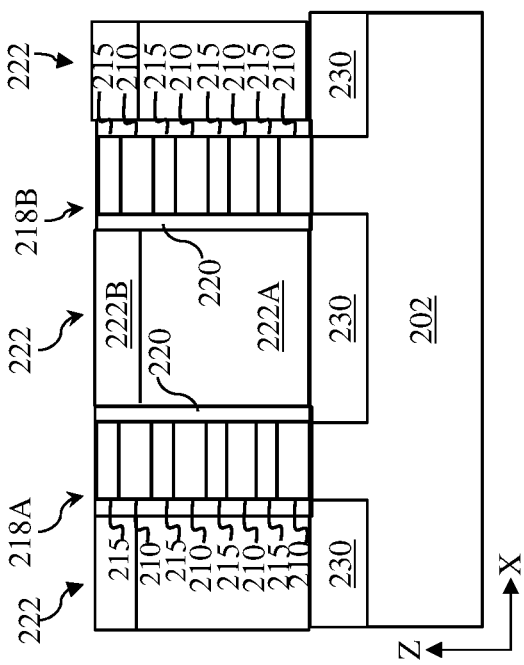

In the present embodiment, dielectric fins 222 may are formed among the fins 218. The dielectric fins 222 are dielectric features of one or more dielectric material. Only one dielectric fin 222 is illustrated in FIG. 3B. More dielectric fins 222 may present, such as one on left side of the fin 218A and another one on right side of the fin 218B. The dielectric fin 222 may be formed by any suitable method that including deposition. In some embodiments, the dielectric fin 222 includes a dielectric stack 222A and a self-aligned cap 222B disposed on the dielectric stack 222A and aligned with the dielectric stack 222A, as illustrated in FIG. 3E. In furtherance of the embodiment, the dielectric fin 222 is formed by a procedure that includes a deposition of one or more dielectric material to fill in the gap between the fins 218; performing a chemical mechanical polishing (CMP) process; selectively etching to recess the deposited dielectric material; depositing another dielectric material and performing another CMP process to form the dielectric stack 222A and the self-aligned cap 222B. In some embodiments, the dielectric fin 222 includes a conformal dielectric layer 222C and a bulk dielectric layer 222D disposed on the conformal dielectric layer 222C, as illustrated in FIG. 3F. In furtherance of the embodiment, the dielectric fin 222 is formed by a procedure that includes a conformal deposition of one or more dielectric material to in the gap between the fins 218 and depositing another dielectric material on the conformal dielectric layer 222C to fill in the gap between the fins 218; and performing a CMP process. In some embodiments, the hard mask used to pattern semiconductor stacks 218 may be removed at this stage. Thus, the dielectric fin 222 is extended above the fins 218.

Turning to FIGS. 4A-4D, gate structures 240 are formed over portions of fins 218A, 218B, over dielectric fin 222, and over isolation features 230. Gate structures 240 extend lengthwise in a direction that is different than (e.g., orthogonal to) the lengthwise direction of fins 218A, 218B. For example, gate structures 240 extend substantially parallel to one another along the x-direction, having a length defined in the y-direction, a width defined in the x-direction, and a height defined in the z-direction. Gate structures 240 are disposed on portions of fins 218A, 218B and define source/drain regions 242 and channel regions 244 of fins 218A, 218B. In the X-Z plane, gate structures 240 wrap top surfaces and sidewall surfaces of fins 218A, 218B. In the Y-Z plane, gate structures 240 are disposed over top surfaces of respective channel regions 244 of fins 218A, 218B, such that gate structures 240 interpose respective source/drain regions 242. Each gate structure 240 includes a gate region 240-1 that corresponds with a portion of the respective gate structure 240 that will be configured for an n-type GAA transistor (and thus corresponds with a portion spanning an n-type GAA transistor region) and a gate region 240-2 that corresponds with a portion of the respective gate structure 240 that will be configured for a p-type GAA transistor (and thus corresponds with a portion spanning a p-type GAA transistor region). Gate structures 240 may be configured differently in gate region 240-1 and gate region 240-2, depending on the transistors to be formed on these regions, such as p-type transistors or n-type transistors. For example, each of gate structures 240 spans gate region 240-1 and gate region 240-2 and may be configured differently in gate region 240-1 and gate region 240-2 to optimize performance of the n-type GAA transistors (having n-gate electrodes in gate regions 240-1) and the p-type GAA transistors (having p-gate electrodes in gate regions 240-2). Accordingly, gate regions 240-1 will be referred to as n-type gate regions 240-1 and gate regions 240-2 will be referred to as p-type gate regions 240-2 hereinafter.

In FIGS. 4A-4D, each gate structure 240 includes a dummy gate stack 245. In the depicted embodiment, a width of dummy gate stacks 245 defines a gate length (Lg) of gate structures 240 (here, in the y-direction), where the gate length defines a distance (or length) that current (e.g., carriers, such as electrons or holes) travels between source/drain regions 242 when the n-type GAA transistor and/or the p-type GAA transistor are switched (turned) on. In some embodiments, the gate length is about 5 nm to about 250 nm. Gate length can be tuned to achieve desired operation speeds of the GAA transistors and/or desired packing density of the GAA transistors. For example, when a GAA transistor is switched on, current flows between source/drain regions of the GAA transistor. Increasing the gate length increases a distance required for current to travel between the source/drain regions, increasing a time it takes for the GAA transistor to switch fully on. Conversely, decreasing the gate length decreases the distance required for current to travel between the source/drain regions, decreasing a time it takes for the GAA transistor to switch fully on. Smaller gate lengths provide GAA transistors that switch on/off more quickly, facilitating faster, high speed operations. Smaller gate lengths also facilitate tighter packing density (i.e., more GAA transistors can be fabricated in a given area of an IC chip), increasing a number of functions and applications that can be fabricated on the IC chip. In the depicted embodiment, the gate length of one or more of gate structures 240 is configured to provide GAA transistors having short-length (SC) channels. For example, the gate length of SC GAA transistors is about 5 nm to about 20 nm. In some embodiments, multigate device 200 can include GAA transistors having different gate lengths.

Dummy gate stacks 245 include a dummy gate electrode, and in some embodiments, a dummy gate dielectric. The dummy gate electrode includes a suitable dummy gate material, such as polysilicon layer. In embodiments where dummy gate stacks 245 include a dummy gate dielectric disposed between the dummy gate electrode and fins 218A, 218B, the dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina (HfO$_2$—Al$_2$O$_3$) alloy, other suitable high-k dielectric materials, or combinations thereof. In some embodiments, the dummy gate dielectric includes an interfacial layer (including, for example, silicon oxide) disposed over fins 218A, 218B and a high-k dielectric layer disposed over the interfacial layer. Dummy gate stacks 245 can include numerous other layers, for example, capping layers, interface layers, diffusion layers, barrier layers, hard mask layers, or combinations thereof. For example, dummy gate stacks 245 can further include a hard mask layer disposed over the dummy gate electrode.

Dummy gate stacks 245 are formed by deposition processes, lithography processes, etching processes, other suitable processes, or combinations thereof. For example, a deposition process is performed to form a dummy gate electrode layer over fins 218A, 218B and isolation features 230. In some embodiments, a deposition process is performed to form a dummy gate dielectric layer over fins 218A, 218B and isolation features 230 before forming the dummy gate electrode layer. In such embodiments, the dummy gate electrode layer is deposited over the dummy gate dielectric layer. In some embodiment, a hard mask layer is deposited over the dummy gate electrode layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some embodiments, the dummy gate dielectric layer and the hard mask layer) to form dummy gate stacks 245, such that dummy gate stacks 245 (including the dummy gate electrode layer, the dummy gate dielectric layer, the hard mask layer, and/or other suitable layers) is configured as depicted in FIGS. 4A-4D. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

In some embodiments, an lightly doped source/drain (LDD) implantation process may be applied to the semiconductor stacks 218 to form LDD features (not shown) aligned with edges of the gate stacks 245. LDD features are separately formed for n-type GAA transistors and p-type GAA transistors. For example, LDD features for n-type GAA transistors includes n-type dopant, such as phosphorous while LDD features for p-type GAA transistors includes p-type dopant, such as boron. In some embodiments, an etching process may be applied to selectively remove the cladding layer 220 at this stage or after the formation of the gate spacers 247.

Each gate structure 240 further includes gate spacers 247 disposed adjacent to (i.e., along sidewalls of) respective dummy gate stacks 245. Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 245 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 245. In such implementations, the various sets of spacers can include materials having different etch rates. For example, a first dielectric layer including silicon and oxygen (e.g., silicon oxide) can be deposited and etched to form a first spacer set adjacent to dummy gate stacks 245, and a second dielectric layer including silicon and nitrogen (e.g., silicon nitride) can be deposited and etched to form a second spacer set adjacent to the first spacer set.

Turning to FIGS. 5A-5D, exposed portions of fins 218A, 218B (i.e., source/drain regions 242 of fins 218A, 218B that are not covered by gate structures 240) are at least partially removed to form source/drain trenches (recesses) 250. In the depicted embodiment, an etching process completely removes semiconductor layer stack 205 in source/drain regions 242 of fins 218A, 218B, thereby exposing the substrate portion of fins 218A, 218B in source/drain regions 242 (e.g., p-well 204A and n-well 204B). Source/drain trenches 250 thus have sidewalls defined by remaining portions of semiconductor layer stack 205, which are disposed in channel regions 244 under gate structures 240, and bottoms defined by substrate 202, such as top surfaces of p-well 204A and n-well 204B in source/drain regions 242. In some embodiments, the etching process removes some, but not all, of semiconductor layer stack 205, such that source/drain trenches 250 have bottoms defined by semiconductor layer 210 or semiconductor layer 215 in source/drain regions 242. In some embodiments, the etching process further removes some, but not all, of the substrate portion of fins 218A, 218B, such that source/drain recesses 250 extend below a topmost surface of substrate 202. The etching process can include a dry etching process, a wet etching process, other suitable etching process, or combinations thereof. In some embodiments, the etching process is a multi-step etch process. For example, the etching process may include alternative etchants to separately and alternately remove semiconductor layers 210 and semiconductor layers 215. In some embodiments, parameters of the etching process are configured to selectively etch semiconductor layer stack with minimal (to no) etching of gate structures 240 (i.e., dummy gate stacks 245 and gate spacers 247) and/or isolation features 230. In some embodiments, a lithography process, such as those described herein, is performed to form a patterned mask layer that covers gate structures 240 and/or isolation features 230, and the etching process uses the patterned mask layer as an etch mask.

Turning to FIGS. 6A-6D, inner spacers 255 are formed in channel regions 244 along sidewalls of semiconductor layers 210 by any suitable process. For example, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and substrate 202 under gate spacers 247. Portions (edges) of semiconductor layers 215 are thus suspended in the channel regions 244 under gate spacers 247. In some embodiments, the gaps extend partially under dummy gate stacks 245. The first etching process is configured to laterally etch (e.g., along the y-direction) semiconductor layers 210, thereby reducing a length of semiconductor layers 210 along the y-direction. The first etching process is a dry etching process, a wet etching process, other suitable etching process, or combinations thereof. A deposition process then forms a spacer layer over gate structures 240 and over features defining source/drain trenches 250 (e.g., semiconductor layers 215, semiconductor layers 210, and substrate 202), such as CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills the source/drain trenches 250. The deposition process is configured to ensure that the spacer layer fills the gaps between semiconductor layers 215 and between semiconductor layers 215 and substrate 202 under gate spacers 247. A second etching process is then performed that selectively etches the spacer layer to form inner spacers 255 as depicted in FIGS. 6A-6D with minimal (to no) etching of semiconductor layers 215, dummy gate stacks 245, and gate spacers 247. In some embodiments, the spacer layer is removed from sidewalls of gate spacers 247, sidewalls of semiconductor layers 215, dummy gate stacks 245, and substrate 202. The spacer layer (and thus inner spacers 255) includes a material that is different than a material of semiconductor layers 215 and a material of gate spacers 247 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that spacer layer includes a doped dielectric material.

Turning to FIGS. 7A-7F, epitaxial source/drain features are formed in source/drain recesses 250. For example, a semiconductor material is epitaxially grown from portions of substrate 202 and semiconductor layers 215 exposed by source/drain recesses 250, forming epitaxial source/drain features 260A in source/drain regions 242 that correspond with n-type GAA transistor regions and epitaxial source/drain features 260B in source/drain regions 242 that correspond with p-type GAA transistor regions. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor layer stack 205 (in particular, semiconductor layers 215). Epitaxial source/drain features 260A, 260B are doped with n-type dopants and/or p-type dopants. In some embodiments, for the n-type GAA transistors, epitaxial source/drain features 260A include silicon. Epitaxial source/drain features 260A can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type GAA transistors, epitaxial source/drain features 260B include silicon germanium or germanium. Epitaxial source/drain features 260B can be doped with boron, other p-type dopant, or combinations thereof (for example, forming Si:Ge:B epitaxial source/drain features). In some embodiments, epitaxial source/drain features 260A and/or epitaxial source/drain features 260B include more than one epitaxial semiconductor layer, where the epitaxial semiconductor layers can include the same or different materials and/or dopant concentrations. In some embodiments, epitaxial source/drain features 260A, 260B include materials and/or dopants that achieve desired tensile stress and/or compressive stress in respective channel regions 244. In some embodiments, epitaxial source/drain features 260A, 260B are doped during deposition by adding impurities to a source material of the epitaxy process (i.e., in-situ). In some embodiments, epitaxial source/drain features 260A, 260B are doped by an ion implantation process subsequent to a deposition process. In some embodiments, annealing processes (e.g., rapid thermal annealing (RTA) and/or laser annealing) are performed to activate dopants in epitaxial source/drain features 260A, 260B and/or other source/drain regions (for example, heavily doped source/drain regions and/or lightly doped source/drain (LDD) regions). In some embodiments, epitaxial source/drain features 260A, 260B are formed in separate processing sequences that include, for example, masking p-type GAA transistor regions when forming epitaxial source/drain features 260A in n-type GAA transistor regions and masking n-type GAA transistor regions when forming epitaxial source/drain features 260B in p-type GAA transistor regions.

Particularly, the source/drain features 260A and 260B are engineered to have desired shapes and sizes with airgaps formed the corresponding source/drain features and the adjacent dielectric fins 222. In various embodiments, the source/drain features 260A and 260B may be engineered to have a bar-like shape as illustrated in FIG. 7E or lollipop-like shape as illustrated in FIG. 7F. FIGS. 7E and 7F are diagrammatic cross-sectional views of multigate device 200 in an X-Z plane along lines E-E' of FIG. 7A, constructed in accordance with various embodiments.

In FIG. 7E, the source/drain feature 260, such as 260A or 260B, is disposed between the adjacent dielectric fins 222 but is controlled not fully epitaxially grown, resulting in the source/drain feature with a bar-like profile and airgaps 226 between the source/drain feature and the adjacent dielectric fin 222. The airgaps 226 are to be sealed by a seal layer at later stage such as by a dielectric layer. The airgaps 226 can effectively reduce the parasitic capacitance. As illustrated in FIG. 7A, the airgap 226 spans along Y direction between the gate spacers 247, and spans along X direction between the sidewall of the source/drain feature 260 and the sidewall of the dielectric fin 222. Furthermore, the airgap 226 vertically spans along Z direction between the isolation feature 230 and the sealing layer, such as inter-layer dielectric layer or contact etch-stop layer, as illustrated in FIG. 9F. The source/drain feature 260, in a cross-sectional view, includes a bar-like profile with a substantial same width along the Y direction. Particularly, the distance or spacing between the adjacent dielectric fins 222 is S; and the source/drain feature 260 includes a top portion with a width $W_1$ and a bottom portion with a width $W_2$. In some example, the ratio $S/W_2$ ranges between 1.2 and 2.5. In some example, the ratio $W_1/W_2$ ranges between 0.8 and 1.2.

In FIG. 7F, the source/drain feature 260, such as 260A or 260B, is disposed between the adjacent dielectric fins 222 but is controlled not fully epitaxially grown, resulting in the source/drain feature with a lollipop-like profile and airgaps 226 between the source/drain feature and the adjacent dielectric fin 222. The airgaps 226 are to be sealed at later stage. As stated above, the airgaps 226 can effectively reduce the parasitic capacitance. Additionally, the lollipop-like profile of the source/drain feature 260 provides a large top surface for landing a source/drain contact, thereby increasing contact area and reducing the contact resistance. The source/drain feature 260A, in a cross-sectional view, includes a lollipop-like profile with varying width along the Y direction. Particularly, the distance or spacing between the adjacent dielectric fins 222 is S; and the source/drain feature 260A includes a top portion with a width $W_1$ and a bottom portion with a width $W_2$. In some example, the ratio $S/W_2$ is greater than 1.2 or ranges between 1.2, and the ratio $W_1/W_2$ is greater than 1.2 or ranges between 1.2 and 2.5. In the extreme case, the top portions of the source/drain features 260 in the lollipop-like profile seals the airgaps 226 so that the dimensions $W_1$ and S are substantially same in this case.

The formation of the source/drain features 260 with various profiles, as illustrated in FIGS. 7E and 7F, are described below with reference to FIG. 8, a flowchart of a method 110 constructed in accordance with some embodiments. The method 110 forms n-type source/drain features 260A and p-type source/drain features 260B, respectively in either sequence. The described example below includes a sequence of forming the n-type source/drain features 260A and thereafter forming p-type source/drain features 260B. However, the sequence is only for illustration and it is not limiting. For example, the method 110 may include a sequence of forming the p-type source/drain features 260B and thereafter forming n-type source/drain features 260A according to other embodiments.

Referring to FIG. 8, the method 110 includes a block 152 to form a first mask patterned with openings to expose first source/drain recesses (trenches) 250 associated with n-type transistors within first regions. The first mask covers second source/drain recesses (trenches) 250 associated with p-type transistors within second regions. The first mask may be a hard mask (such as dielectric material layer) or soft mask (such as photoresist layer) formed by a suitable procedure, such as deposition, lithography process and etching.

The method 110 proceeds to a block 154 for cleaning the recessed semiconductor surfaces through the openings of the first mask and preparing the surface for selective epitaxial growth. In some embodiments, the cleaning chemical includes a suitable cleaning solution, such as hydrofluoric acid, a mixture of ammonia, hydrogen peroxide and water, or a mixture of hydrochloric acid, hydrogen peroxide and water.

The method 110 proceeds to a block 156 to epitaxially grow one or more semiconductor material with a precursor a recipe to control epitaxial growth rate and duration to form n-type source/drain features 260A in the first source/drain recesses. The epitaxial growth selectively grows on the semiconductor surfaces relative to the dielectric surfaces, such as isolation features 230 and the dielectric fins 222. When the epitaxial growth time (duration) is long enough, the epitaxially grown source/drain features 260A will gradually extend to the dielectric surfaces and completely fill in the gaps between the dielectric fins 222. However, when the epitaxial growth is controlled with a limited duration by a suitable technique, such as in time-mode based on the manufacturing data, the airgaps 226 are formed between the source/drain features 260A and the dielectric fins 222, as illustrated in FIG. 7E or 7F.

Furthermore, the source/drain profile can also be controlled by tuning the epitaxial growth rate. When the epitaxial growth rate is higher, the top portion of the source/drain feature is grown faster and reduce the epitaxial growth of the bottom portion due the limitation of the chemical supply, thereby forming the source/drain feature with a lollipop-like profile, as illustrated in FIG. 7F. In contrary to the above situation, when the epitaxial growth rate is slower, the top portion of the source/drain feature is grown slower and remain sufficient opening to the bottom. The epitaxial growth of the bottom portion is not limited by the chemical supply, thereby forming the source/drain feature with a bar-like profile, as illustrated in FIG. 7E.

In the disclosed embodiment, the epitaxial growth rate is controlled by chemicals in the precursor of the epitaxial growth. The precursor includes both a first chemical for epitaxial growth and a second chemical for etching effect. Respective chemical gas flow rate can be controlled by setting the epitaxial growth recipe and corresponding partial gas pressures are controlled. Accordingly, the epitaxial growth rate is controlled as well. The ratio D/E of the deposition chemical D and the etching chemical E (such as ratio of the corresponding partial pressures, or ratio of deposition rate of the deposition chemical over the etching rate of the etching chemical) is controlled to have collective epitaxial growth rate either greater or less. When the ratio D/E is higher, such as greater than 0.5 or ranging between 0.5 and 10, or ranging between 0.6 and 10, and the collective epitaxial growth rate is greater, the formed source/drain features 260A have a lollipop-like geometry as illustrated in FIG. 7F. When the ratio D/E is lower, such as less than 0.5 or ranging between 0.01 and 0.5, or ranging between 0.01 and 0.4, and the collective epitaxial growth rate is less, the formed source/drain features 260A have a bar-like geometry as illustrated in FIG. 7E.

The deposition chemical in the precursor may include dichlorosilane ($SiH_2Cl_2$) for growing silicon. In some embodiments, the deposition chemical in the precursor may include silane ($SiH_4$) or dichlorosilane ($SiH_2Cl_2$) for growing silicon, $GeH_4$ for growing germanium, or both for growing silicon germanium. The precursor also includes chemical for dopant, such as phosphorous-containing chemical for n-type dopant or boron-containing chemical for p-type dopant. In the present embodiment, the precursor for n-type source/drain features 260A includes $SiH_4$ and a phosphorous-containing chemical to form the n-type source/drain features 260A of silicon doped with phosphorous, in some embodiments, the etching chemical includes HCl. In some embodiments, the etching chemical includes chlorine-containing chemical, such as HCl or $Cl_2$, or fluorine-containing chemical, such as $SF_6$, or alternatively both chlorine-containing chemical and fluorine-containing chemical. After the formation of the first source/drain features 260A, the first mask is removed by a suitable method, such as etching for hard mask, or alternatively wet stripping or plasma ashing for soft mask.

In some embodiments, the epitaxial growth is designed with a lower ratio D/E to achieve the bar-like profile, the etching gas in the precursor uses HCl with a flow rate greater than 40000 sccm, or a flow rate ranging between 5000 sccm~40000 sccm. Thus, the epitaxial growth is a bottom-up deposition, thereby forming the source/drain features with a bar-like geometry as illustrated in FIG. 7E. In some embodiments, the epitaxial growth is designed with a higher ratio D/E to achieve the lollipop-like profile, the etching gas in the precursor uses HCl with a flow rate less than 20000 sccm, or ranging between 0 sccm~20000 sccm, the epitaxial growth forms the source/drain features with a lollipop-like geometry as illustrated in FIG. 7F.

The method 110 proceeds to a block 158 to form a second mask patterned with openings to expose second source/drain recesses (trenches) 250 associated with p-type transistors within second regions. The second mask covers first source/ drain recesses (trenches) 250 associated with n-type transistors within first regions. The second mask may be a hard mask (such as dielectric material layer) or soft mask (such as photoresist layer) formed by a suitable procedure, such as deposition, lithography process and etching.

The method 110 proceeds to a block 160 for cleaning the recessed semiconductor surfaces through the openings of the second mask and preparing the surface for selective epitaxial growth. In some embodiments, the cleaning chemical includes a suitable cleaning solution, such as hydrofluoric acid, a mixture of ammonia, hydrogen peroxide and water, or a mixture of hydrochloric acid, hydrogen peroxide and water.

The method 110 proceeds to a block 162 to epitaxially grow one or more semiconductor material with a precursor a recipe to control epitaxial growth rate and duration to form p-type source/drain features 260B in the second source/drain recesses. The epitaxial growth selectively grows on the semiconductor surfaces relative to the dielectric surfaces, such as isolation features 230 and the dielectric fins 222. As described above, When the ratio D/E is higher, and the collective epitaxial growth rate is greater, the formed source/drain features 260A have a lollipop-like geometry as illustrated in FIG. 7F. When the ratio D/E is lower, and the collective epitaxial growth rate is less, the formed source/drain features 260A have a bar-like geometry as illustrated in FIG. 7E. In the present embodiment, the precursor for p-type source/drain features 260B includes $SiH_4$, $GeH_4$, and a boron-containing chemical to form the p-type source/drain features 260B of silicon germanium doped with boron.

After the formation of the second source/drain features 260B, the second mask is removed by a suitable method, such as etching for hard mask, or alternatively wet stripping or plasma ashing for soft mask.

In alternative embodiments, the epitaxial growth is a cyclic process with epitaxial growth and etching process separately implemented and alternatively sequenced. Each cycle includes an epitaxial growth for deposition with a first precursor of deposition chemical for a first duration and an etching process for etching with a second precursor of etching for a second duration. In this case, the ratio D/E is defined as the first duration (deposition time) over the second duration (etching time). The ratio D/E is controlled similarly to achieve desired source/drain profile, such as a bar-like profile (as illustrated in FIG. 7E) by lowering the ratio D/E or a lollipop-like profile (as illustrated in FIG. 7F) by increasing the ratio D/E. For example, when the ratio D/E is higher, such as greater than 0.5 or ranging between 0.5 and 10, or ranging between 0.6 and 10, and the collective epitaxial growth rate is greater, the formed source/drain features 260A have a lollipop-like geometry as illustrated in FIG. 7F. When the ratio D/E is lower, such as less than 0.5 or ranging between 0.01 and 0.5, or ranging between 0.01 and 0.4, and the collective epitaxial growth rate is less, the formed source/drain features 260A have a bar-like geometry as illustrated in FIG. 7E.

The desired profiles of the source/drain features 260 depend on individual application with consideration of various factors, such as parasitic capacitance and contact resistance. For example, when the contact resistance is major concern, the epitaxial growth is controlled to form the source/drain features with a lollipop-like profile by tuning the ratio D/E higher. More particularly, the ratio $W_1/W_2$ is tuned to a greater value to increase the contact area, such as greater than 1.2 or ranging between 1.2 and 2.5. In other examples, when the parasitic capacitance or circuit timing are major concern, the epitaxial growth is controlled to form the source/drain features with a bar-like profile by tuning the ratio D/E lower. More particularly, the ratio $W_1/W_2$ is tuned to be about 1, such as ranging between 0.8 and 1.2. In yet other examples, when both parasitic capacitance and contact resistance are major concerns, the epitaxial growth is controlled to form the source/drain features with a profile by tuning the ratio D/E lower and the processing time so that both airgaps 226 are increased and the dimension $W_1$ is increased as well. More particularly, the ratio $W_1/W_2$ is tuned to higher, such as greater than 1.2 or ranging between 1.2 and 2.5; and the ratio $S/W_2$ is tuned to higher, such as greater than 1.2 or ranging between 1.2 and 2.5.

In some embodiments, the source/drain features 260A for n-type transistors and the source/drain features 260B for p-type transistors are tuned differently. For example, the source/drain features 260A for n-type transistors are tuned to have a lollipop-like profile and the source/drain features 260B for p-type transistors are tuned to have a bar-like profile to optimize the overall circuit performance.

After the formation of the source/drain features 260, the airgaps 226 are sealed, such as by the top portions of the lollipop-like source/drain features 260 as described above, or alternatively sealed by a contact etch-stop layer (CESL) or an inter-layer dielectric (ILD) layer as described below.

Turning to FIGS. 9A-9F, an inter-level dielectric (ILD) layer 270 is formed over isolation features 230, epitaxial source/drain features 260A, 260B, the airgaps 226 and gate spacers 247, for example, by a deposition process (such as CVD, PVD, ALD, HDPCVD, MOCVD, RPCVD, PECVD, LPCVD, ALCVD, APCVD, plating, other suitable methods, or combinations thereof). ILD layer 270 is disposed between adjacent gate structures 240. In some embodiments, ILD layer 270 is formed by a flowable CVD (FCVD) process that includes, for example, depositing a flowable material (such as a liquid compound) over multigate device 200 and converting the flowable material to a solid material by a suitable technique, such as thermal annealing and/or ultraviolet radiation treating. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In the depicted embodiment, ILD layer 270 is a dielectric layer that includes a low-k dielectric material (generally referred to as a low-k dielectric layer). ILD layer 270 can include a multilayer structure having multiple dielectric materials. In some embodiments, a contact etch-stop layer (CESL) is disposed between ILD layer 270 and isolation features 230, epitaxial source/drain features 260A, 260B, and gate spacers 247. The CESL includes a material different than ILD layer 270, such as a dielectric material that is different than the dielectric material of ILD layer 270. For example, where ILD layer 270 includes a low-k dielectric material, the CESL includes silicon and nitrogen, such as silicon nitride or silicon oxynitride. Subsequent to the deposition of ILD layer 270 and/or the CESL, a CMP process and/or other planarization process can be performed until reaching (exposing) a top portion (or top surface) of dummy gate stacks 245. In some embodiments, the planarization process removes hard mask layers of dummy gate stacks 245 to expose underlying dummy gate electrodes of dummy gate stacks 245, such as polysilicon gate electrode layers.

Accordingly, the airgaps 226 are sealed by the CESL or ILD layer, as illustrated in FIG. 9E or 9F.

ILD layer 270 may be a portion of a multilayer interconnect (MLI) feature disposed over substrate 202. The MLI feature electrically couples various devices (for example, p-type GAA transistors and/or n-type GAA transistors of multigate device 200, transistors, resistors, capacitors, and/or inductors) and/or components (for example, gate structures and/or epitaxial source/drain features of p-type GAA transistors and/or n-type GAA transistors), such that the various devices and/or components can operate as specified by design requirements of multigate device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of multigate device 200 and/or distribute signals (for example, clock signals, voltage signals, and/or ground signals) to the devices and/or the components of multigate device 200.

Turning to FIGS. 10A-10D, dummy gate stacks 245 are removed from gate structures 240, thereby exposing semiconductor layer stacks 205 of fins 218A, 218B in n-type gate regions 240-1 and p-type gate regions 240-2. In the depicted embodiment, an etching process completely removes dummy gate stacks 245 to expose semiconductor layers 215 and semiconductor layers 210 in channel regions 244. The etching process is a dry etching process, a wet etching process, other suitable etching process, or combinations thereof. In some embodiments, the etching process is a multi-step etch process. For example, the etching process may include alternative etchants to separately remove various layers of dummy gate stacks 245, such as the dummy gate electrode layers, the dummy gate dielectric layers, and/or the hard mask layers. In some embodiments, the etching process is configured to selectively etch dummy gate stacks 245 with minimal (to no) etching of other features of multigate device 200, such as ILD layer 270, gate spacers 247, isolation features 230, semiconductor layers 215, and semiconductor layers 210. In some embodiments, a lithography process, such as those described herein, is performed to form a patterned mask layer that covers ILD layer 270 and/or gate spacers 247, and the etching process uses the patterned mask layer as an etch mask.

Turning to FIGS. 11A-11D, semiconductor layers 210 of semiconductor layer stack 205 (exposed by gate trenches 275) are selectively removed from channel regions 244, thereby forming suspended semiconductor layers 215' in channel regions 244. In the depicted embodiment, an etching process selectively etches semiconductor layers 210 with minimal (to no) etching of semiconductor layers 215 and, in some embodiments, minimal (to no) etching of gate spacers 247 and/or inner spacers 255. Various etching parameters can be tuned to achieve selective etching of semiconductor layers 210, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 210 (in the depicted embodiment, silicon germanium) at a higher rate than the material of semiconductor layers 215 (in the depicted embodiment, silicon) (i.e., the etchant has a high etch selectivity with respect to the material of semiconductor layers 210). The etching process is a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 210. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch semiconductor layers 210. In some embodiments, a chemical vapor phase etching process using hydrochloric acid (HCl) selectively etches semiconductor layers 210.

At least one suspended semiconductor layer 215' is thus exposed in n-type gate regions 240-1 and p-type gate regions 240-2 by gate trenches 275. In the depicted embodiment, each n-type gate region 240-1 and each p-type gate region 240-2 includes four suspended semiconductor layers 215' vertically stacked that will provide four channels through which current will flow between respective epitaxial source/drain features (epitaxial source/drain features 260A or epitaxial source/drain features 260B) during operation of the GAA transistors. Suspended semiconductor layers 215' are thus referred to as channel layers 215' hereinafter. Channel layers 215' in n-type gate regions 240-1 are separated by gaps 277A, and channel layers 215' in p-type gate regions 240-2 are separated by gaps 277B. Channel layers 215' in n-type gate regions 240-1 are also separated from substrate 202 by gaps 277A, and channel layers 215' in p-type gate regions 240-2 are also separated by gaps 277B. A spacing s1 is defined between channel layers 215' along the z-direction in n-type gate regions 240-1, and a spacing s2 is defined between channel layers 215' along the z-direction in p-type gate regions 240-2. Spacing s1 and spacing s2 correspond with a width of gaps 277A and gaps 277B, respectively. In the depicted embodiment, spacing s1 is about equal to s2, though the present disclosure contemplates embodiments where spacing s1 is different than spacing s2. In some embodiments, spacing s1 and spacing s2 are both about equal to thickness t1 of semiconductor layers 210. Further, channel layers 215' in n-type gate regions 240-1 have a length l1 along the x-direction and a width w1 along the y-direction, and channel layers 215' in p-type gate regions 240-2 have a length l2 along the y-direction and a width w2 along the x-direction. In the depicted embodiment, length l1 is about equal to length l2, and width w1 is about equal to width w2, though the present disclosure contemplates embodiments where length l1 is different than length l2 and/or width w1 is different than width w2. In some embodiments, length l1 and/or length l2 is about 10 nm to about 50 nm. In some embodiments, width w1 and/or width w2 is about 4 nm to about 10 nm. In some embodiments, each channel layer 215' has nanometer-sized dimensions and can be referred to as a "nanowire," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure, and the process depicted in FIGS. 10A-10D can be referred to as a channel nanowire release process. In some embodiments, after removing semiconductor layers 210, an etching process is performed to modify a profile of channel layers 215' to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the channel layers 215' (nanowires) have sub-nanometer dimensions depending on design requirements of multigate device 200.

Turning to FIGS. 12A-12D, gate stacks 360A and 360B are formed over multigate device 200. The formation of the gate stacks includes deposition and planarization process, such as CMP. The gate stacks 360A and 360B may be collectively formed or alternatively, separately formed, depending on the type of GAA transistors, such as n-type GAA transistors or p-type GAA transistors. Accordingly, the gate stacks 360A and 360B may have the same compositions or alternatively different compositions, such as different work function metal layers (as described below). Each of the gate stacks 360A and 360B includes a gate dielectric layer and a gate electrode disposed on the gate dielectric layer. In some embodiments, the gate dielectric layer includes an interfacial layer 280 and a high-k dielectric layer disposed on the interfacial layer 208. The gate electrode may include one or more conductive materials, such as a capping layer, a work function metal layer, a blocking layer, a metal fill layer, and/or other proper conductive material layers. In some embodiments, the gate electrode includes a work function layer (such as 300 for the gate stack 360A or 310 for the gate stack 360B) and a metal fill layer 350 disposed on the work function metal layer. The work function layers 300 and 310 may be same or different and may be an n-type work function layer or a p-type work function layer, depending the types of the corresponding GAA transistors.

In the depicted embodiment, the gate dielectric layer includes an interfacial layer 280 and a high-k dielectric layer 282, where interfacial layer 280 is disposed between the high-k dielectric layer 282 and channel layers 215'. In furtherance of the depicted embodiment, interfacial layer 280 and high-k dielectric layer 282 partially fill gaps 277A between channel layers 215' and between channel layers 215' and substrate 202 in the first gate region 240-1 and partially fill gaps 277B between channel layers 215' and between channel layers 215' and substrate 202 in the second gate region 240-2. In some embodiments, interfacial layer 280 and/or high-k dielectric layer 282 are also disposed on substrate 202, isolation features 230, and/or gate spacers 247. Interfacial layer 280 includes a dielectric material, such as $SiO_2$, HfSiO, SiON, other silicon-comprising dielectric material, other suitable dielectric material, or combinations thereof. High-k dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Interfacial layer 280 is formed by any of the processes described herein, such as thermal oxidation, chemical oxidation, ALD, CVD, other suitable process, or combinations thereof. In some embodiments, interfacial layer 280 has a thickness of about 0.5 nm to about 3 nm. High-k dielectric layer 282 is formed by any of the processes described herein, such as ALD, CVD, PVD, oxidation-based deposition process, other suitable process, or combinations thereof. In some embodiments, high-k dielectric layer 282 has a thickness of about 1 nm to about 2 nm.

The work function layer (300 or 310) is formed over multigate device 200, particularly over high-k dielectric layer 282. For example, an ALD process conformally deposits the work function layer on high-k dielectric layer 282, such that the work function layer has a substantially uniform thickness and partially fills gate trenches 275. The work function layer can be formed using another suitable deposition process, such as CVD, PVD, HDPCVD, MOCVD, RPCVD, PECVD, LPCVD, ALCVD, APCVD, spin coating, plating, other deposition process, or combinations thereof. For example, the work function layer is disposed along sidewalls, tops, and bottoms of channel layers 215'. A thickness of the work function layer is configured to at least partially fill gaps (277A or 277B) between channel layers 215' and between channel layers 215' and substrate 202 (and, in some embodiments, without filling gate trenches 275 along the gate length direction (here, along the y-direction)). In some embodiments, the work function layer has a thickness of about 1 nm to about 10 nm. In some embodiments, p-type work function layer includes any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. In the depicted embodiment, p-type work function layer includes titanium and nitrogen, such as TiN. In some embodiments, the n-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In the depicted embodiment, n-type work function layer includes aluminum.

A metal fill (or bulk) layer 350 is formed over multigate device 200, particularly over the work function layer 300 in the first gate regions 240-1 and over the work function layer 310 in the second gate regions 240-2. For example, a CVD process or a PVD process deposits metal fill layer 350 such that metal fill layer 350 fills any remaining portion of gate trenches 275, including any remaining portions of gaps (277A or 277B) in the gate regions 240-1 and 240-2. Metal fill layer 350 includes a suitable conductive material, such as Al, W, and/or Cu. Metal fill layer 350 may additionally or collectively include other metals, metal oxides, metal nitrides, other suitable materials, or combinations thereof. Alternatively, metal fill layer 350 is formed using another suitable deposition process, such as ALD, CVD, PVD, HDPCVD, MOCVD, RPCVD, PECVD, LPCVD, ALCVD, APCVD, spin coating, plating, other deposition process, or combinations thereof. In the depicted embodiment, the metal fill layer 350 is formed by PVD to form a seed layer and followed by plating to completely form the metal fill layer.

A planarization process is performed to remove excess gate materials from multigate device 200. For example, a CMP process is performed until a top surface of ILD layer 270 is reached (exposed), such that a top surface of gate structures 240 are substantially planar with a top surface of ILD layer 270 after the CMP process. Accordingly, multigate device 200 includes first GAA transistors having a gate stack 360A wrapping respective channel layers 215', such that gate stack 360A is disposed between respective epitaxial source/drain features 260A, and second GAA transistor having metal gate stacks 360B wrapping respective channel layers 215', such that metal gates 360B are disposed between respective epitaxial source/drain features 260B.

Fabrication can proceed to continue fabrication of multigate device 200. For example, various contacts can be formed to facilitate operation of the n-type GAA transistors and the p-type GAA transistors. For example, one or more ILD layers, similar to ILD layer 270, and/or CESL layers can be formed over substrate 202 (in particular, over ILD layer 270 and gate structures 240). Contacts can then be formed in ILD layer 270 and/or ILD layers disposed over ILD layer 270. For example, contacts are respectively electrically and/or physically coupled with gate structures 240 and contacts are respectively electrically and/or physically coupled to source/drain regions of the n-type GAA transistors and the p-type GAA transistors (particularly, epitaxial source/drain features 260A, 260B). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 270 and the contacts (for example, extending through ILD layer 270 and/or the other ILD layers) are a portion of the MLI feature described above.

Other fabrication processes may be applied to the workpiece 200 and may implemented before, during, or after the processes described above, such as various processing steps to form an interconnect structure over the GAA transistors from the frontside of substrate 202 to electrically connects various circuit components including the first GAA transistors in the first region 202A and the second GAA transistors in the second region 202B. The interconnect structure includes metal lines distributed in multiple metal layers (such as $1^{st}$ metal layer, $2^{nd}$ metal layer, $3^{rd}$ metal layer, and etc. from the bottom up to the top metal layer) to provide horizontal routing and contact features (between the substrate and the first metal layer, and via features (between the metal layers) to provide vertical routing. The multigate device 200 also includes other components, such as other conductive features (such as redistribution layer or RDL), passivation layer(s) to provide sealing effect, and/or bonding structures to provide an interface between the multigate device 200 and a circuit board (such as a printed circuit board) to be formed on the interconnect structure.

In some embodiments, the source/drain features may be formed by other suitable method. For example, the method includes first etching to recess the source/drain regions; a deposition process to deposit one or more sacrificial material layers on sidewalls of the dielectric fins; and epitaxially growth with one or more semiconductor material. The method further includes second etching to remove the deposited sacrificial material layer leaving airgaps between the epitaxial grown source/drain feature and the adjacent dielectric fin. The deposition is designed to form the sacrificial layer with desired shape, such that the final S/D feature has a bar or lollipop like shape. For example, the deposition may include one or more deposition process controlled to have respective deposition characteristics, such as one with conformal deposition (such as atomic layer deposition), another one with more directional deposition (such as bottom-up deposition, or plasma deposition with higher bias power), and another one with more lateral deposition. In some embodiments, the deposited layer is trimmed to achieve the desired shape by a suitable process, such as performing tilted plasma treatment to the upper portions of the deposited dielectric layer, and then another etching process to partially remove the lower portions of the deposited dielectric layer.

The present disclosure provides multigate device and method making the same for many different embodiments. An exemplary multigate device includes source/drain features formed with various profiles, such as a bar-like profile as illustrated in FIG. 7E or a lollipop-like profile as illustrated in FIG. 7F, with airgaps formed between the source/drain features and the adjacent dielectric fins. Such formed structure may include various benefits including parasitic capacitance and/or contact resistance. The method making the multigate device includes controlling the epitaxial growth and tuning the deposition/etching ratio D/E of the epitaxial growth to form the source/drain features and with desired profile and airgaps.

In one example aspect, the present disclosure provides a method of semiconductor fabrication. The method includes forming a semiconductor stack on a substrate, wherein the semiconductor stack includes a first semiconductor layers and a second semiconductor layers alternatively disposed, the first semiconductor layers and the second semiconductor layers being different in composition; patterning the semiconductor stack to form a semiconductor fin; forming a dielectric fin next to the semiconductor fin; forming a first gate stack on the semiconductor fin and the dielectric fin; etching to a portion of the semiconductor fin within a source/drain region, resulting in a source/drain recess; and epitaxially growing a source/drain feature in the source/drain recess, defining an airgap spanning between a sidewall of the source/drain feature and a sidewall of the dielectric fin.

Another one aspect of the present disclosure pertains to a method of semiconductor fabrication. The method includes forming a semiconductor stack on a substrate, wherein the semiconductor stack includes a first semiconductor layers and a second semiconductor layers alternatively disposed, the first semiconductor layers and the second semiconductor layers being different in composition; patterning the semiconductor stack to form a semiconductor fin; forming a dielectric fin next to the semiconductor fin; forming a first gate stack on the semiconductor fin and the dielectric fin; etching to a portion of the semiconductor fin within a source/drain region, resulting in a source/drain recess; and epitaxially growing a source/drain feature in the source/drain recess in a cyclic process, defining an airgap spanning between a sidewall of the source/drain feature and a sidewall of the dielectric fin, wherein each cycle of the cyclic process includes a first duration of deposition using a first precursor having a deposition chemical and a second duration of etching using a second precursor having an etching chemical.

Yet another aspect of the present disclosure pertains to a semiconductor structure. The semiconductor structure includes a semiconductor fin and a dielectric fin disposed on a substrate, wherein the semiconductor fin includes multiple channels vertically stacked; a gate stack disposed on the substrate and extending to surround each of the multiple channels; and a source/drain feature formed on the semiconductor fin and connected each of the multiple channels, defining an airgap extending to the dielectric fin and being capped by a dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a semiconductor stack on a substrate, wherein the semiconductor stack includes a first semiconductor layers and a second semiconductor layers alternatively disposed, the first semiconductor layers and the second semiconductor layers being different in composition;
patterning the semiconductor stack to form a semiconductor fin;
forming an isolation feature over the substrate to surround a bottom portion of the semiconductor fin;
after the forming of the isolation feature, depositing a cladding layer along a top surface and sidewalls of the semiconductor fin;
after the depositing of the cladding layer, forming a dielectric fin over a top surface of the isolation feature next to the semiconductor fin;
forming a first gate stack on the semiconductor fin and the dielectric fin;
after the forming of the first gate stack, selectively removing the cladding layer;
etching to a portion of the semiconductor fin within a source/drain region, resulting in a source/drain recess; and
epitaxially growing a source/drain feature in the source/drain recess, defining an airgap spanning between a sidewall of the source/drain feature and a sidewall of the dielectric fin.

2. The method of claim 1, further comprising depositing a dielectric layer to seal the airgap.

3. The method of claim 2, wherein the dielectric layer includes at least one of a contact etch-stop layer and an inter-layer dielectric layer.

4. The method of claim 2, wherein
the semiconductor fin and the dielectric fin longitudinally extend along a first direction, and being spaced away along a second direction that is orthogonal to the first direction;
the first gate stack longitudinally extends along the second direction; and
the source/drain feature is formed on the semiconductor fin with the airgap spanning between the source/drain feature and the dielectric fin along the second direction.

5. The method of claim 4, further comprising
a second gate stack longitudinally extends along the second direction and is spaced away from the first gate stack along the first direction; and
a first gate spacer disposed on a sidewall of the first gate stack and a second gate spacer disposed on a sidewall of the second gate stack, wherein the airgap spans between the first gate spacer and the second gate spacer along the first direction.

6. The method of claim 4, wherein
the semiconductor fin extends above the top surface of the isolation feature; and
the airgap vertically spans from the dielectric layer to the isolation feature.

7. The method of claim 2, wherein the epitaxially growing a source/drain feature includes epitaxially growing the source/drain feature using a precursor having a deposition chemical and an etching chemical.

8. The method of claim 7, wherein
the deposition chemical includes at least one of $SiH_4$, $GeH_4$ and $SiH_2Cl_2$; and
the etching chemical includes at least one of HCl, $Cl_2$ and $SF_6$.

9. The method of claim 8, wherein the epitaxially growing a source/drain feature includes applying HCl with a flowrate of HCl less than 20000 sccm, resulting in the source/drain feature with a lollipop-like shape.

10. The method of claim 8, wherein the epitaxially growing a source/drain feature includes applying HCl with a flowrate of HCl greater than 40000 sccm, resulting in the source/drain feature with a bar-like shape.

11. The method of claim 2, wherein the epitaxially growing a source/drain feature includes epitaxially growing the source/drain feature in a cyclic process, wherein each cycle includes a first duration of deposition using a first precursor having a deposition chemical and a second duration of etching using a second precursor having an etching chemical.

12. The method of claim 11, wherein a ratio of the first duration over the second duration is greater than 0.5, resulting in the source/drain feature with a lollipop-like shape.

13. The method of claim 11, wherein a ratio of the first duration over the second duration is less than 0.5, resulting in the source/drain feature with a bar-like shape.

14. The method of claim 1, further comprising:
removing the first gate stack, resulting in a gate trench in an inter-layer dielectric (ILD) layer;
selectively removing the first semiconductor layers within the gate trench; and
depositing a gate dielectric layer and a gate conductive layer surrounding each of the second semiconductor layers, wherein the source/drain feature contacts each of the second semiconductor layers.

15. A method, comprising:
forming a semiconductor stack on a substrate, wherein the semiconductor stack includes a first semiconductor layers and a second semiconductor layers alternatively disposed, the first semiconductor layers and the second semiconductor layers being different in composition;
patterning the semiconductor stack to form a semiconductor fin;
forming an isolation feature over the substrate to surround a bottom portion of the semiconductor fin;
after the forming of the isolation feature, depositing a semiconductor cladding layer along a top surface and sidewalls of the semiconductor fin;
after the depositing of the semiconductor cladding layer, forming a dielectric fin over a top surface of the isolation feature next to the semiconductor fin;
forming a first gate stack on the semiconductor fin and the dielectric fin;
after the forming of the first gate stack, selectively removing the semiconductor cladding layer;
etching to a portion of the semiconductor fin within a source/drain region, resulting in a source/drain recess; and
epitaxially growing a source/drain feature in the source/drain recess in a cyclic process, defining an airgap spanning between a sidewall of the source/drain feature and a sidewall of the dielectric fin, wherein each cycle of the cyclic process includes a first duration of deposition using a first precursor having a deposition chemical and a second duration of etching using a second precursor having an etching chemical.

16. The method of claim 15, wherein
the deposition chemical includes at least one of $SiH_4$, $GeH_4$ and $SiH_2Cl_2$; and
the etching chemical includes at least one of HCl, $Cl_2$ and $SF_6$.

17. The method of claim 15, wherein a ratio of the first duration over the second duration is greater than 0.5, resulting in the source/drain feature with a lollipop-like shape.

18. A method, comprising:
  forming a semiconductor stack on a substrate, wherein the semiconductor stack includes a first semiconductor layers and a second semiconductor layers alternatively disposed, the first semiconductor layers and the second semiconductor layers being different in composition;
  patterning the semiconductor stack to form a semiconductor fin;
  forming an isolation feature over the substrate to surround a bottom portion of the semiconductor fin;
  after the forming of the isolation feature, depositing a semiconductor cladding layer along a top surface and sidewalls of the semiconductor fin;
  after the depositing of the semiconductor cladding layer, forming a dielectric fin over a top surface of the isolation feature next to the semiconductor fin;
  forming a first gate stack on the semiconductor fin and the dielectric fin;
  after the forming of the first gate stack, selectively removing the semiconductor cladding layer;
  etching to a portion of the semiconductor fin within a source/drain region, resulting in a source/drain recess; and
  epitaxially growing a source/drain feature in the source/drain recess in a cyclic process, defining an airgap spanning between a sidewall of the source/drain feature and a sidewall of the dielectric fin, wherein each cycle of the cyclic process includes a first duration of deposition using a first precursor having a silicon-containing deposition chemical and a second duration of etching using a second precursor having a chlorine-containing etching chemical.

19. The method of claim 18, wherein
the silicon-containing deposition chemical includes $SiH_2Cl_2$; and
the chlorine-containing etching chemical includes HCl.

20. The method of claim 18, wherein the epitaxially growing a source/drain feature includes applying HCl with a flowrate of HCl less than 20000 sccm, resulting in the source/drain feature with a lollipop-like shape.

* * * * *